US012669559B2

(12) United States Patent
Solignac et al.

(10) Patent No.: US 12,669,559 B2
(45) Date of Patent: Jun. 30, 2026

(54) MR SENSORS HAVING LAYER ORIENTATION CONTROL USING SOT CURRENT

(71) Applicants: Allegro MicroSystems, LLC, Manchester, NH (US); Commissariat à l'énergie atomique et aux énergies alternatives, Paris (FR)

(72) Inventors: Aurélie Solignac, Massy (FR); Myriam Pannetier-Lecoeur, Bures sur Yvette (FR); Claude Fermon, Gif-sur-Yvette (FR); Paolo Campiglio, Montreuil (FR); Jean-Michel Daga, Bourg-la-Reine (FR)

(73) Assignees: Allegro MicroSystems, LLC, Manchester, NH (US); Commissariat à l'énergir atomique et aux énergies alternatives, Paris (FR)

( * ) Notice: Subject to any disclaimer, the term of this patent is extended or adjusted under 35 U.S.C. 154(b) by 207 days.

(21) Appl. No.: 18/470,538

(22) Filed: Sep. 20, 2023

(65) Prior Publication Data

US 2025/0093433 A1     Mar. 20, 2025

(51) Int. Cl.
G01R 33/09          (2006.01)
(52) U.S. Cl.
CPC ................................. G01R 33/09 (2013.01)
(58) Field of Classification Search
CPC ....................................................... G01R 33/09
See application file for complete search history.

(56) References Cited

U.S. PATENT DOCUMENTS

| | | | |
|---|---|---|---|
| 8,120,003 | B2 | 2/2012 | Wunnicke |
| 8,514,618 | B2 | 8/2013 | Lombard et al. |
| 9,324,936 | B2 | 4/2016 | Prejbeanu et al. |
| 9,583,695 | B2 | 2/2017 | Prejbeanu et al. |
| 9,886,989 | B2 | 2/2018 | Ducruet et al. |
| 11,719,527 | B2 | 8/2023 | Lassalle-Balier |
| 11,852,700 | B2 | 12/2023 | Dounia et al. |
| 11,860,250 | B2 | 1/2024 | Timopheev |

(Continued)

FOREIGN PATENT DOCUMENTS

CN          112082579 A      12/2020

OTHER PUBLICATIONS

U.S. Appl. No. 17/806,336, filed Jun. 10, 2022, Lassalle-Balier et al.

(Continued)

*Primary Examiner* — Alesa Allgood
(74) *Attorney, Agent, or Firm* — DALY, CROWLEY, MOFFORD & DURKEE, LLP

(57)          ABSTRACT

Methods and apparatus for an MR device having a ferromagnetic material, a heavy metal layer configured to flow a charge current, and an insulating layer between the ferromagnetic material and the heavy metal layer. The insulating layer is configured to electrically insulate and to magnetically couple the heavy metal layer and the ferromagnetic layer for generating a field like (FL) field in the ferromagnetic material in response to the charge current. In some embodiments, the MR device comprises a TMR device having a free layer or a reference layer oriented by the charge current. In other embodiments, the MR device comprises a GMR device.

33 Claims, 24 Drawing Sheets

(56) References Cited

U.S. PATENT DOCUMENTS

| | | | |
|---|---|---|---|
| 11,906,553 | B2 | 2/2024 | Timopheev |
| 2006/0022220 | A1* | 2/2006 | Inomata ............... H10D 48/385 |
| 2014/0056061 | A1* | 2/2014 | Khvalkovskiy ....... H01F 41/325 |
| | | | 365/158 |
| 2014/0124882 | A1 | 5/2014 | Khalili Amiri et al. |
| 2016/0276006 | A1* | 9/2016 | Ralph .................... H10N 50/10 |
| 2019/0206602 | A1* | 7/2019 | Sasaki .................... H10N 52/80 |
| 2020/0365653 | A1 | 11/2020 | Tsai et al. |
| 2021/0311139 | A1* | 10/2021 | Suess ..................... H10N 50/10 |
| 2023/0332878 | A1 | 10/2023 | Lassalle-Balier et al. |
| 2023/0400537 | A1 | 12/2023 | Lassalle-Balier et al. |
| 2024/0074322 | A1 | 2/2024 | Klebanov et al. |
| 2024/0168108 | A1 | 5/2024 | Childress et al. |

OTHER PUBLICATIONS

U.S. Appl. No. 17/931,197, filed Sep. 12, 2022, Jaiswal et al.
U.S. Appl. No. 18/333,680, filed Jun. 13, 2023, Jaiswal.
PCT International Search Report and Written Opinion dated Nov. 8, 2024 for International Application No. PCT/US2024/038171; 17 Pages.
Cosset-Cheneau et al., "Measurement of the Spin Absorption Anisotropy in Lateral Spin Valves;" Journal Article from Phys. Rev. Letters 126, 027201; Jul. 28, 2020; 6 Pages.
Dang et al., "Anomalous Hall Effect in 3d/5d Multilayers Mediated by Interface Scatterings and the Nonlocal Spin-Conductivity;" Journal Article from Phys. Rev. B 102, 144405; Oct. 5, 2020; 41 Pages.
Figueiredo-Prestes et al., "Magnetization Switching and Deterministic Nucleation in Co/Ni Multilayered Disks Induced by Spin-Orbit Torques;" Research Article from Applied Physics Letters 119, 032410; Jul. 21, 2021; 8 Pages.
Garello et al., "Ultrafast Magnetization Switching by Spin-Orbit Torques;" Journal Article from Applied Physics Letters; Sep. 4, 2014; 5 Pages.
Jotta Garcia et al., "Spin-Torque Dynamics for Noise Reduction in Vortex-Based Sensors;" Journal Article from Applied Physics Letters 118, 122401; Dec. 17, 2020; 5 Pages.

Kang et al., "Current-Induced Manipulation of Exchange Bias in IrMn/NiFe Bilayer Structures;" Article from Nature Communications 12, 6420; Jan. 2021; 7 Pages.
Li et al., "Manipulation of Magnetizations by Spin-Orbit Torques;" Article from Advanced Quantum Technology, 2, 1800052; Jan. 2019; 44 Pages.
Liu et al., "Spin Torque Switching with the Giant Spin Hall Effect of Tantalum;" Journal Article from Science, 336 (6081); Jan. 2012; 31 Pages.
Miron et al., "Perpendicular Switching of a Single Ferromagnetic Layer Induced by In-Plane Current Injection;" Article from Nature, 476 (7539); Submitted Oct. 17, 2019; 7 Pages.
Moulin et al., "Optimizing Magnetoresistive Sensor Signal-to-Noise Via Pinning Field Tuning;" Journal Article from Applied Physics Letters, 115, 122406; Jan. 2019; 5 Pages.
Shao et al., "Roadmap of Spin-Orbit Torques;" Proceedings of IEEE Transactions on Magnetics, 57 (7); Jan. 2021; 68 Pages.
Xie et al., "Spin Torque Gate Magnetic Field Sensor;" Journal Article from Phys. Rev. Appl. 15; Jan. 2021; 19 Pages.
Xu et al., "Macro-Spin Modeling and Experimental Study of Spin-Orbit Torque Biased Magnetic Sensors;" Article from Journal of Applied Physics, vol. 122; Jan. 2017; 30 Pages.
U.S. Appl. No. 18/294,283, filed Feb. 1, 2024, Timopheev et al.
U.S. Appl. No. 18/419,683, filed Jan. 23, 2024, Lassalle-Balier et al.
U.S. Appl. No. 18/428,150, filed Jan. 31, 2024, Gurcan et al.
U.S. Appl. No. 18/440,322, filed Feb. 13, 2024, Jaiswal et al.
U.S. Appl. No. 18/458,441, filed Aug. 30, 2023, Daigle et al.
U.S. Appl. No. 18/503,333, filed Nov. 7, 2023, Daigle et al.
U.S. Appl. No. 18/511,743, filed Nov. 16, 2023, Campiglio et al.
U.S. Appl. No. 18/606,125, filed Mar. 15, 2024, Lassalle-Balier et al.
U.S. Appl. No. 18/628,319, filed Apr. 5, 2024, Lehndorff et al.
U.S. Appl. No. 18/652,971, filed May 2, 2024, Campiglio et al.
U.S. Appl. No. 18/660,811, filed May 10, 2024, Strelkov et al.
U.S. Appl. No. 18/679,972, filed May 31, 2024, Ducruet.
U.S. Appl. No. 18/709,631, filed May 13, 2024, Strelkov et al.
U.S. Appl. No. 18/740,749, filed Jun. 12, 2024, Dounia et al.

\* cited by examiner

1450

MR SENSORS HAVING LAYER ORIENTATION CONTROL USING SOT CURRENT

BACKGROUND

Magnetic field sensors are used in a variety of applications, including, but not limited to, angle sensing that senses an angle of a direction of a magnetic field, current sensing that senses a magnetic field generated by a current carried by a current-carrying conductor, magnetic switching that senses the proximity of a ferromagnetic object, rotation detection that senses passing ferromagnetic articles, for example, magnetic domains of a ring magnet or a ferromagnetic target (e.g., gear teeth) where the magnetic field sensor is used in combination with a back-biased or other magnet, and magnetic field sensing that senses a magnetic field density of a magnetic field.

In certain applications, magnetic field sensors include magnetoresistance elements. These elements have an electrical resistance that changes in the presence of an external magnetic field. Spin valves are a type of magnetoresistance element formed from two or more magnetic materials or layers. The simplest form of a spin valve has a reference (or magnetically fixed) layer and a free layer. The resistance of the spin valve changes as a function of the magnetic alignment of the reference and free layers. Typically, the magnetic alignment of the reference layer does not change, while the magnetic alignment of the free layer moves in response to external magnetic fields. When the separation between the free layer and the reference layer is a thin insulating layer, the spin valve is called a TMR spin valve.

In some cases, a spin valve may also have a bias. The bias may be generated by one or more magnetic layers (bias layers) that are magnetically coupled to the free layer. In the absence of an external magnetic field, the bias layers may cause the magnetic alignment of the free layer to default to a predetermined alignment. The magnetic coupling between the bias layers and the free layer is relatively weak so that an external field can override the bias and realign the magnetic alignment of the free layer.

SUMMARY

Embodiments of the disclosure provide methods and apparatus for a MR sensor having tuned spin-orbit torque (SOT) to control the free and/or reference layer of the sensor. A charge current can be injected through a heavy metal (HM) layer in contact with a ferromagnetic layer to create a spin current used to control the ferromagnetic layer magnetic orientation in a sensor. The HM layer can be in direct contact with a ferromagnetic layer without electrical insulation. Concurrent SOT control of the ferromagnetic layer and TMR read operation can be achieved with floating supplies used with the HM shared by two TMR pillars. SOT may be used to switch the reference in a stable orientation with no concurrent TMR read in an architecture using switches to allow connecting TMR pillars in series. In embodiments, a sensor includes a stack arrangement having an insulating layer to allow concurrent control of the ferromagnetic layer while reading serially connected TMR pillars. In embodiments, the insulating layer provides electrical insulation between the ferromagnetic layer and the heavy metal so that the current is flowing through the tunnel barriers of serially connected pillars instead of flowing to the heavy metal through the insulating material. The insulating layer also provides transmission of the field like (FL) or damping like (DL) created by the spin current due to good conduction of the spin Hall current, and/or by Rashba coupling.

In embodiments, a stack arrangement allows control of the free layer since the HM is magnetically connected to the free layer. A charge current parallel to the reference magnetic orientation (sensitive axis) may generate a FL field biasing the free layer perpendicularly to the sensitive axis: this linearizes the response of the stack—the stack linear range can be modulated dynamically by changing the charge current (i.e., the FL field). A charge current perpendicular to the reference magnetic orientation generates a FL field along the sensitive axis: this FL field can be used to cancel the field in a feedback loop architecture (replacing external coils). In some embodiments, a charge current having a parallel component and a perpendicular component is used to linearize the stack and cancel the field at the same time.

In embodiments, an MR sensor includes metal contact between free layers in order to obtain individual sizing of free layers. In some embodiments, an MR sensor has a stack arrangement to orient the reference layer. The charge current direction along the reference axis can be changed at high frequency: the reference magnetic orientation may be switched at high frequency, chopping the electronic 1/f noise and offset that can be rejected. In some embodiments, a charge current with two components can be used to set the reference in any direction (0-360 deg) to provide a particular sensor, such as angular sensor.

In embodiments, a GMR sensor includes SOT tuning for control of the ferromagnetic layer without degrading the magnetoresistance.

BRIEF DESCRIPTION OF THE DRAWINGS

The foregoing features of this invention, as well as the invention itself, may be more fully understood from the following description of the drawings in which.

DETAILED DESCRIPTION

Figure 1:
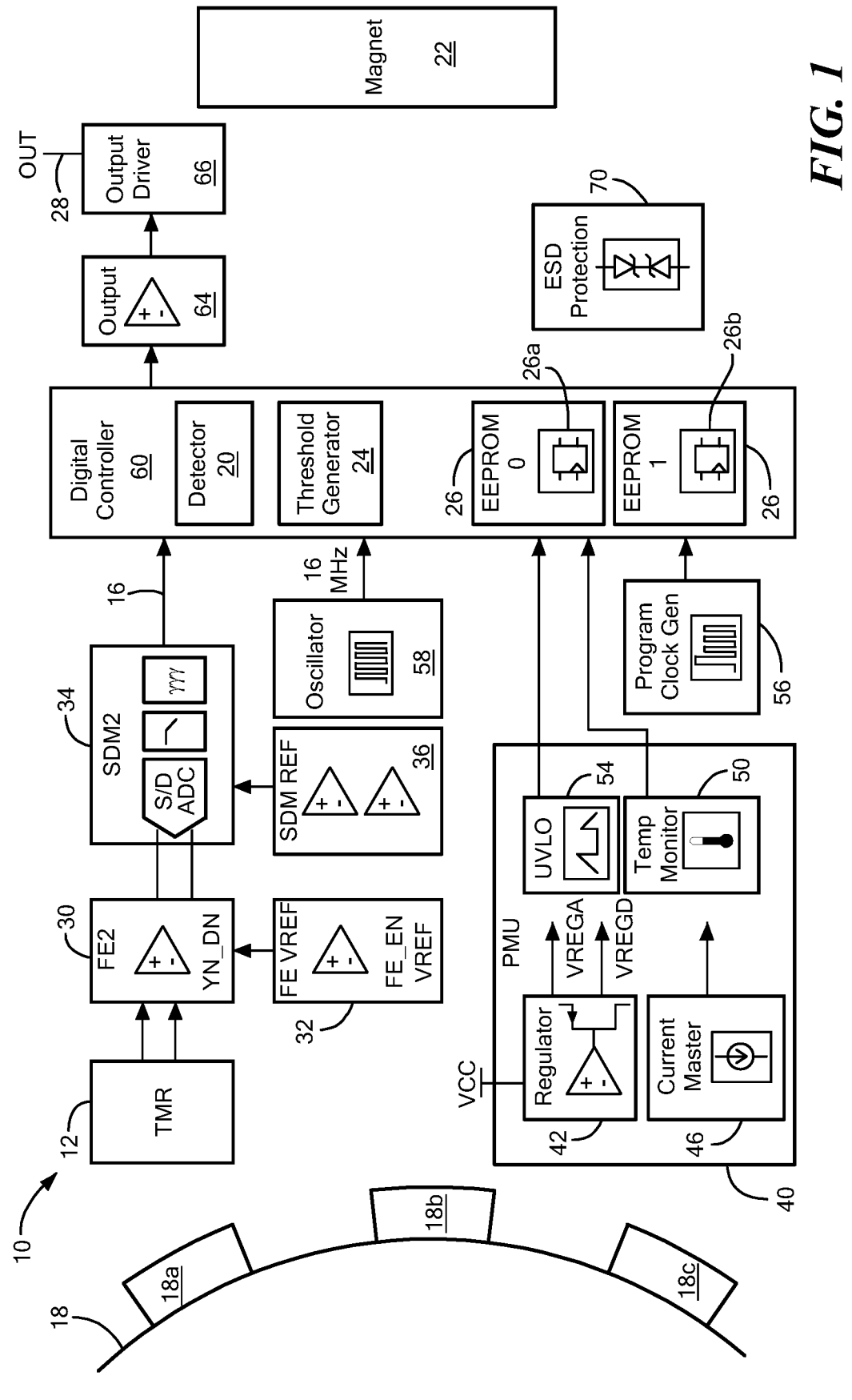
FIG. 1 is a schematic representation of an example sensor having ab MR element with SOT tuning.

FIG. 1 shows an example magnetic field sensor 10 having at least one magnetic field sensing element 12 that includes one or more MR element having SOT tuning in accordance with example embodiments of the disclosure, as shown and described more fully below. The sensor 10 is configured to generate a magnetic field signal 16 indicative of a magnetic field associated with a target 18 and a detector 20 responsive to the magnetic field signal and to a threshold level from a threshold generator 24 to generate a sensor output signal 28 containing transitions associated with features of the target in response to the magnetic field signal crossing the threshold level.

The target 18 can have a variety of forms, including, but not limited to a gear having gear teeth 18a-18c or a ring magnet having one or more pole pair. Also, linear arrangements of ferromagnetic objects that move linearly are possible. In the example embedment of FIG. 1, magnetic field sensor 10 may take the form of a rotation detector to detect passing gear teeth, for example, gear teeth 18a-18c of a ferromagnetic gear or, more generally target object 18. A permanent magnet 22 can be placed at a variety of positions proximate to the gear 18, resulting in fluctuations of a magnetic field proximate to the gear as the gear rotates in a so-called "back-bias" arrangement.

Features of the target 18 are spaced from the sensing elements 12 by an airgap. Although intended to be fixed once the sensor 10 is in place in a particular application, the airgap can vary for a variety of reasons. A difference between angles of the transitions of the sensor output signal 28 and locations of the associated features 18a-18c of the target 28 is referred to as a "hard offset."

Sensing elements 12 can take a variety of forms, such as TMR elements, as may be arranged in one or more bridge or other configurations in order to generate one or more single-ended or differential signals indicative of the sensed magnetic field. A front-end amplifier 30 can be used to process the magnetic field sensing element output signal to generate a further signal for coupling to an analog-to-digital converter (ADC) 34 as may include one or more filters, such as a low pass filter and/or notch filter, and as may take the form of a sigma delta modulator to generate a digital magnetic field signal 16. Features of the magnetic field signal processing can include a front-end reference 32 and a sigma delta reference 36.

Sensor 10 includes a power management unit (PMU) 40 as may contain various circuitry to perform power management functions. For example, a regulator 42 can output a regulated voltage for powering analog circuitry of the sensor (VREGA) and/or a regulated voltage for powering digital circuitry of the sensor (VREGD). A bias current source 46, a temperature monitor 50 and an undervoltage lockout 54 can monitor current, temperature, and voltage levels and provide associated status signals to a digital controller 60. A clock generation element 56 and an oscillator 58 are coupled to the digital controller 60.

Digital controller 60 processes the magnetic field signal 16 to determine the speed, position, and/or direction of movement, such as rotation of target 18 and outputs one or more digital signals to an output protocol module 64. More particularly, controller 60 determines the speed, position, and/or direction of target 18 based on the magnetic field signal 16 and can combine this information with fault information in some embodiments to generate the sensor output signal 28 in various formats. The output of module 64 is fed to an output driver 66 that provides the sensor output signal 28 in various formats, such as a so-called two-wire format in which the output signal is provided in the form of current pulses on the power connection to the sensor or a three-wire format in which the output signal is provided at a separate dedicated output connection. Formats of the output signal 28 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format, or other similar signal formats. Sensor 10 can further include electrostatic discharge (ESD) protection 70.

The digital controller 60 includes detector 20, threshold generator 24, and memory 26 such as EEPROMs 26a, 26b. Memory 26 can be used to store values for various sensor functionality including storing function coefficients for use by the threshold generator 24 in generating the adaptive threshold levels for use by detector 20.

Detector 20 is coupled to receive the threshold level thus generated and the magnetic field signal 16 and compare the received levels to generate a binary, two-state, detector output signal that has transitions when the signal 16 crosses the threshold level. Movement speed of the target 18 can be detected in accordance with the frequency of the binary signal.

It should be appreciated that a direction of rotation of the target 28 may be determined in embodiments containing multiple sensing elements 12 configured to generate phase separated magnetic field signals (as are sometimes referred to as channel signals), in which case the direction of rotation can be determined based on a relative phase or relative time difference (e.g., lag or lead) of a particular edge transition of detector output signals associated with the phase separated magnetic field signals.

It is understood that embodiments of MR-based sensing elements are useful in a wide variety of magnetic sensors. While an example sensor is shown and described above, any practical magnetic sensor in which MR sensing elements are desirable can be provided. For example, MR sensing elements are useful in many magnetic position and angle sensors that require high resolution. Further example sensors in which MR-based sensing elements are shown and described below.

Figure 2:
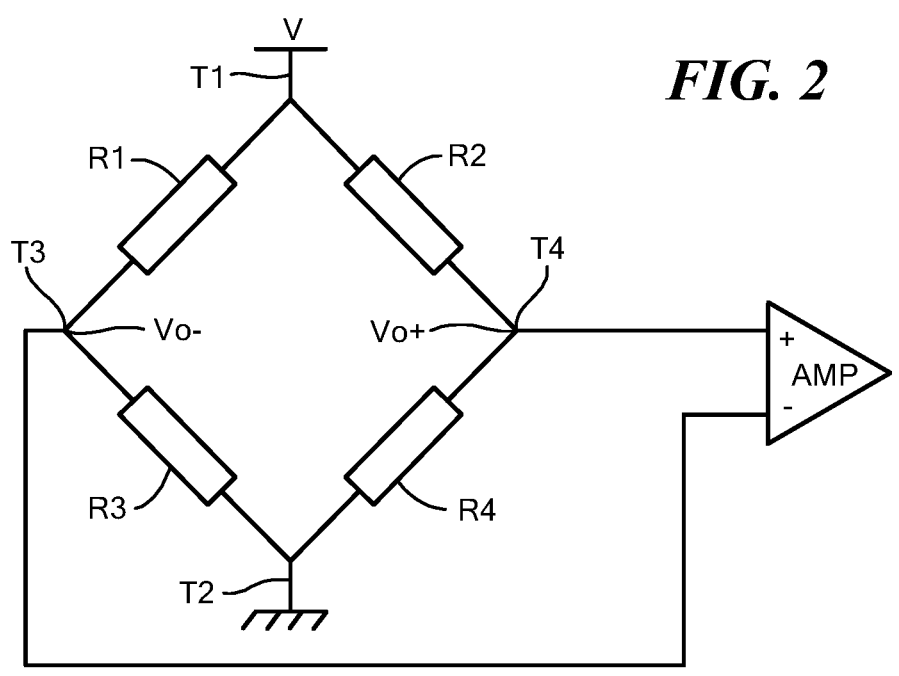
FIG. 2 is schematic representation of an MR bridge with MR elements.

FIG. 2 shows an example TMR bridge 200 having a first resistor R1, a second resistor R2, a third resistor R3, and fourth resistor R4 coupled in a bridge configuration, which can correspond to the sensing elements 12 of FIG. 1. A first terminal T1 is coupled to a voltage supply and a second terminal T2 is coupled to ground (or other potential). A third terminal T3 provides a first differential output signal Vo− and a fourth terminal T4 provides a second differential output signal Vo+. The differential output Vo+, Vo− of the bridge can be provided to an amplifier AMP or other circuitry for processing of the output of the magnetic field sensing elements, such as described above.

Figure 3:
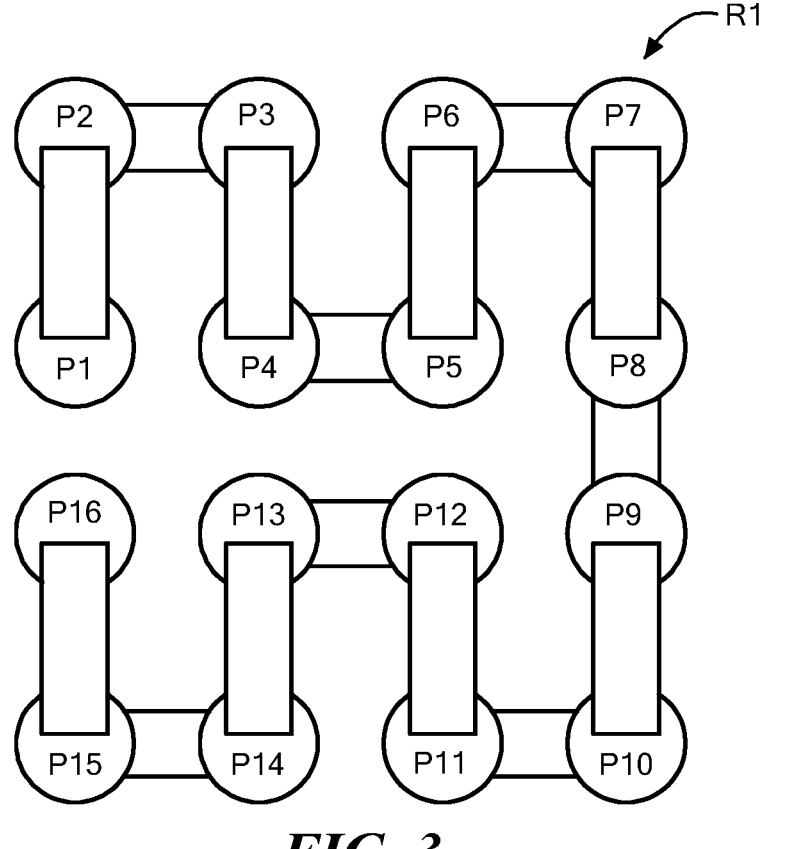
FIG. 3 is a schematic representation of a bridge resistor having TMR pillars with SOT tuning.

FIG. 3 shows an example implementation in which bridge resistor R1 contains sixteen pillars P1-16 that provide the total resistance for R1. It is understood that a TMR resistor that provides a leg of the bridge can comprise any practical number of pillars connected in series and/or in parallel to provide the TMR bridge resistor. Pillars can be designed to have the same or different resistances.

Figure 4:
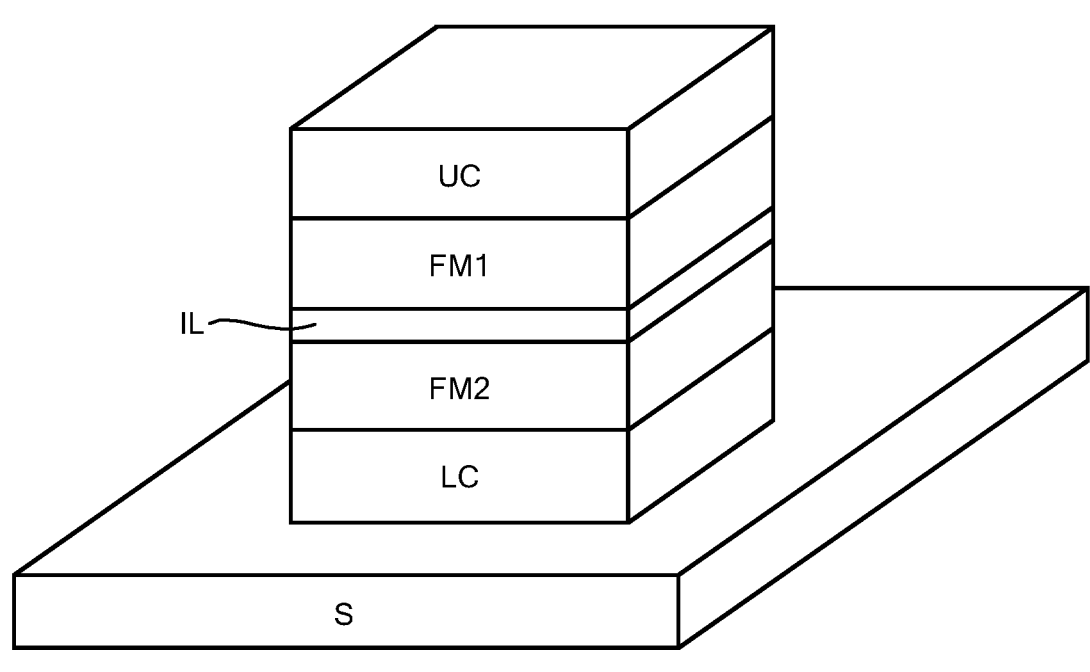
FIG. 4 is a schematic representation of a MTJ with tunneling magnetoresistance.

FIG. 4 shows an example magnetic tunnel junction (MTJ) that uses TMR to provide TMR elements, e.g., pillars. As is known in the art, tunneling magnetoresistance (TMR) occurs in a magnetic tunnel junction (MTJ) which has first and second ferromagnets FM1, FM2 separated by a thin insulative layer IL, such as MgO. An upper contact UC can be provided on the first ferromagnet FM1 and a lower contact LC can be provided on the second ferromagnet FM2. A substrate S can support the MTJ structure. The insulating layer should be thin, in the order of one nanometer, so as to allow electrons to 'tunnel' from one of the ferromagnets to the other. It will be appreciated that this is a quantum mechanical phenomenon.

The direction of the two magnetizations of the ferromagnetic films FM1, FM2 can be switched individually by an external magnetic field. If the magnetizations are in a parallel orientation it is more likely that electrons will tunnel through the insulating film IL than if they are in the oppositional (antiparallel) orientation. Consequently, such a junction can be switched between two states of electrical resistance, one with low resistance and one with high resistance.

It is understood that the directions of FM1 and FM2 do not necessarily have to be switched: if the external field angle is neither parallel or anti-parallel then the resulting magnetization changes as the composite angle between the external field and the reference layer. The resistance variation is proportional to the cosine of such composite angle which makes TMR elements useful for angle sensing applications.

Electrons with certain spin orientation ("spin-up" or "spin-down") can tunnel from one ferromagnetic layer to another ferromagnetic layer through the non-conductive thin insulating layer if there are available free states with the same spin orientation. In case of the parallel state, the majority spin ("spin-up") electrons and minority spin ("spin-down") electrons can tunnel to the second ferromagnetic layer and fill majority ("up") and minority ("down") states, respectively. This will result in large conductance and corresponds to the low resistive state. In case of the anti-parallel state, the majority spin ("spin-down") electrons and minority spin ("spin-up") electrons from first ferromagnetic layer fill the minority ("down") and majority ("up") states in the second ferromagnetic layer, respectively. This will result in the low conductance and corresponds to the high resistive state. Tunneling magnetoresistance is described in J. Mathon, *Theory of Tunneling Magnetoresistance,* 76 PHASE TRANSITIONS 491-500 (2003), which is incorporated herein by reference.

Figure 5:
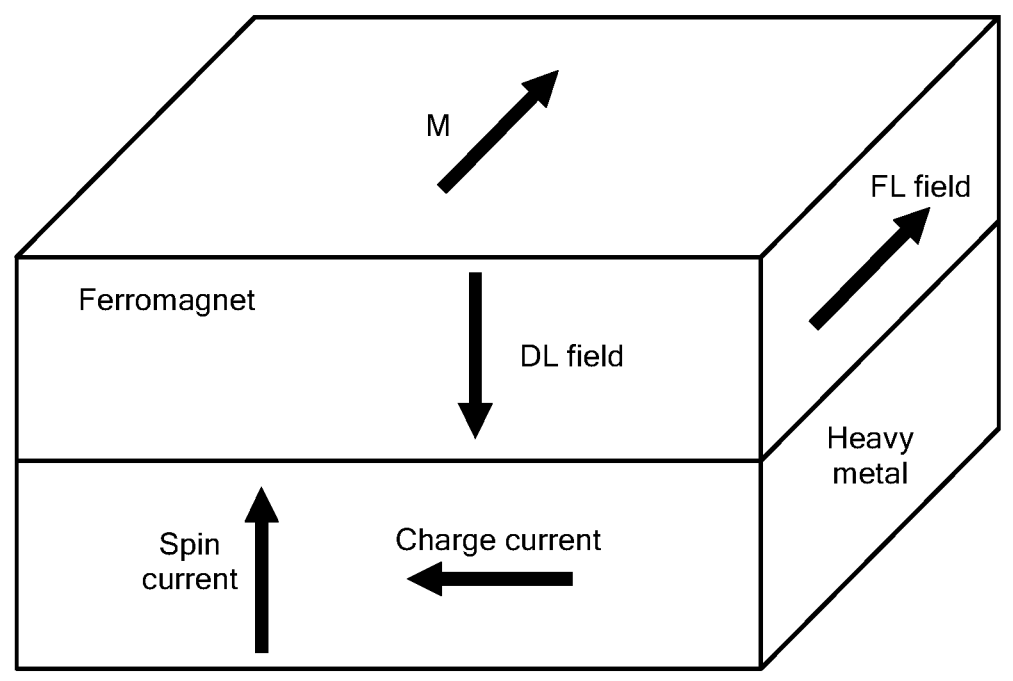
FIG. 5 is a schematic representation of the field like and the damping like orientations as function of the current and magnetization orientation in a thin magnetic film in contact with an HM film.

FIG. 5 shows an example of a Ferromagnetic layer/heavy metallic layer having a spin-orbit torque (SOT) configuration. During SOT operation, an electrical charge current flowing in a spin-orbit (SO) material, such as a heavy metal, is converted into a transverse pure spin current able to act, such as through a transfer of spin angular momentum, on an adjacent layer, such as Co, CoFe, CoFeB or NiFe. This transfer of spins leads to a magnetic torque exerted on a ferromagnet that changes its magnetization M. Typically, currents are of the order of $10^{11}$ A·m$^{-2}$. As used herein, a heavy metal layer refers to a metal having a high atomic weight presenting a strong orbit coupling. Example materials include Pt, Ta, W Pd, and Ir.

The resultant torque exerted on the ferromagnetic layer include a first component referred to as a DL (damping like) field and a second component referred to as a FL (field like) field. The FL field is planar in the plane of the ferromagnetic layer and the DL field is perpendicular to the plane. As described more fully below, example embodiments of an MR sensor having SOT tuning use the FL or the DL field to control the reference and/or the free layer.

Figures 6A, 6B, 6C:
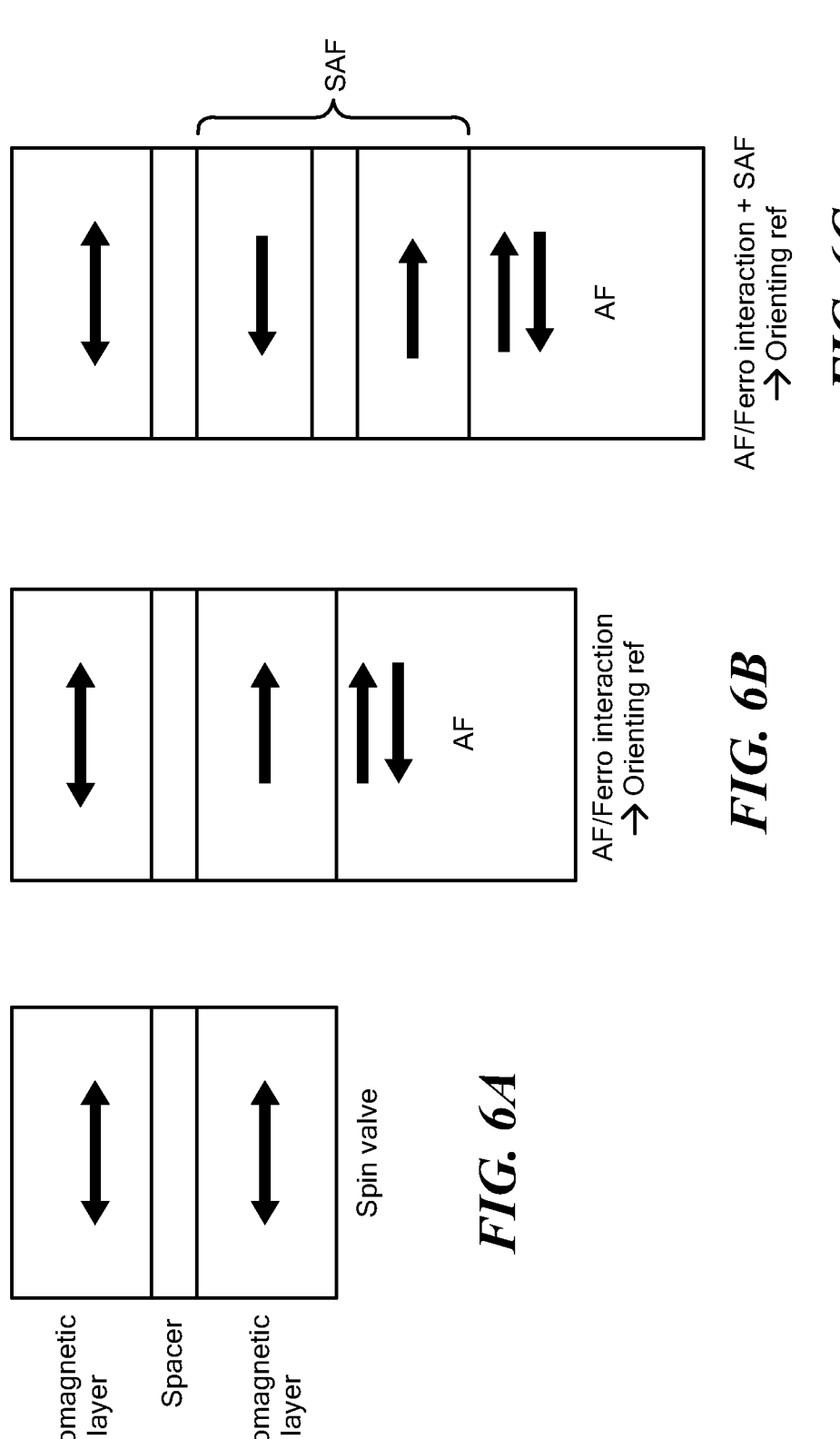
FIG. 6A is schematic representation of a spin valve having ferromagnetic layers separated by a spacer layer.
FIG. 6B shows a spin valve having ferromagnetic layers separated by a spacer layer and an antiferromagnet layer for orienting a reference layer.
FIG. 6C shows a spin valve having ferromagnetic layers separated by a spacer layer, an antiferromagnet layer for orienting a reference layer, and a synthetic antiferromagnet (SAF) layer for orienting the reference layer.

FIG. 6A shows a spin valve having ferromagnetic layers separated by a spacer layer. FIG. 6B shows a spin valve having ferromagnetic layers separated by a spacer layer and an antiferromagnet layer for orienting a reference layer. FIG. 6C shows a spin valve having ferromagnetic layers separated by a spacer layer, an antiferromagnet layer for orienting a reference layer, and a synthetic antiferromagnet (SAF) layer for orienting the reference layer.

Figure 7B:
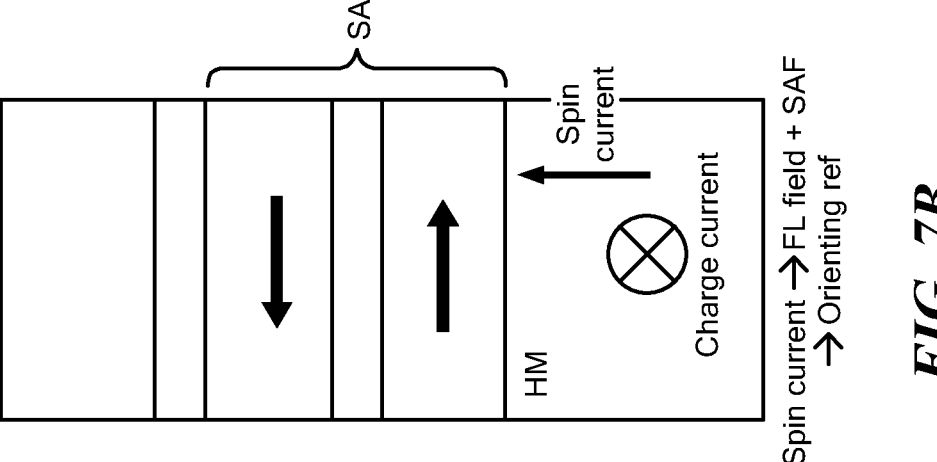
FIG. 7B shows charge current flowing into the page, as indicated by the x in a circle, a resultant spin current flowing up to the reference layer/SAF for orienting the reference layer.
Figure 7A:
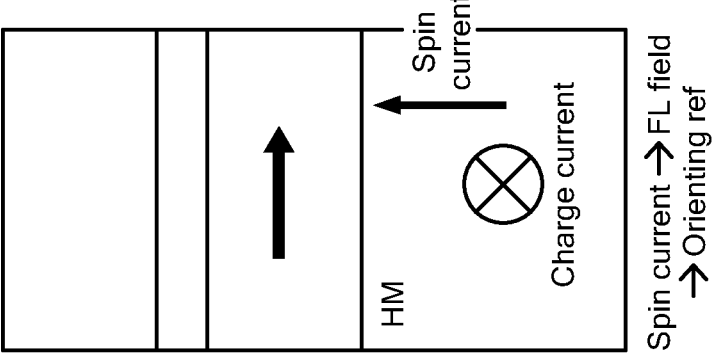
FIG. 7A shows charge current flowing into the page and a resultant spin current flowing up to the reference layer with a planar FL field for orienting the reference layer.

FIG. 7A shows charge current flowing into the page, as indicated by the x in a circle, a resultant spin current flowing up to the reference layer with a planar FL field for orienting the reference layer. FIG. 7B shows charge current flowing into the page, as indicated by the x in a circle, a resultant spin current flowing up to the reference layer/SAF for orienting the reference layer.

Figures 8A, 8B:
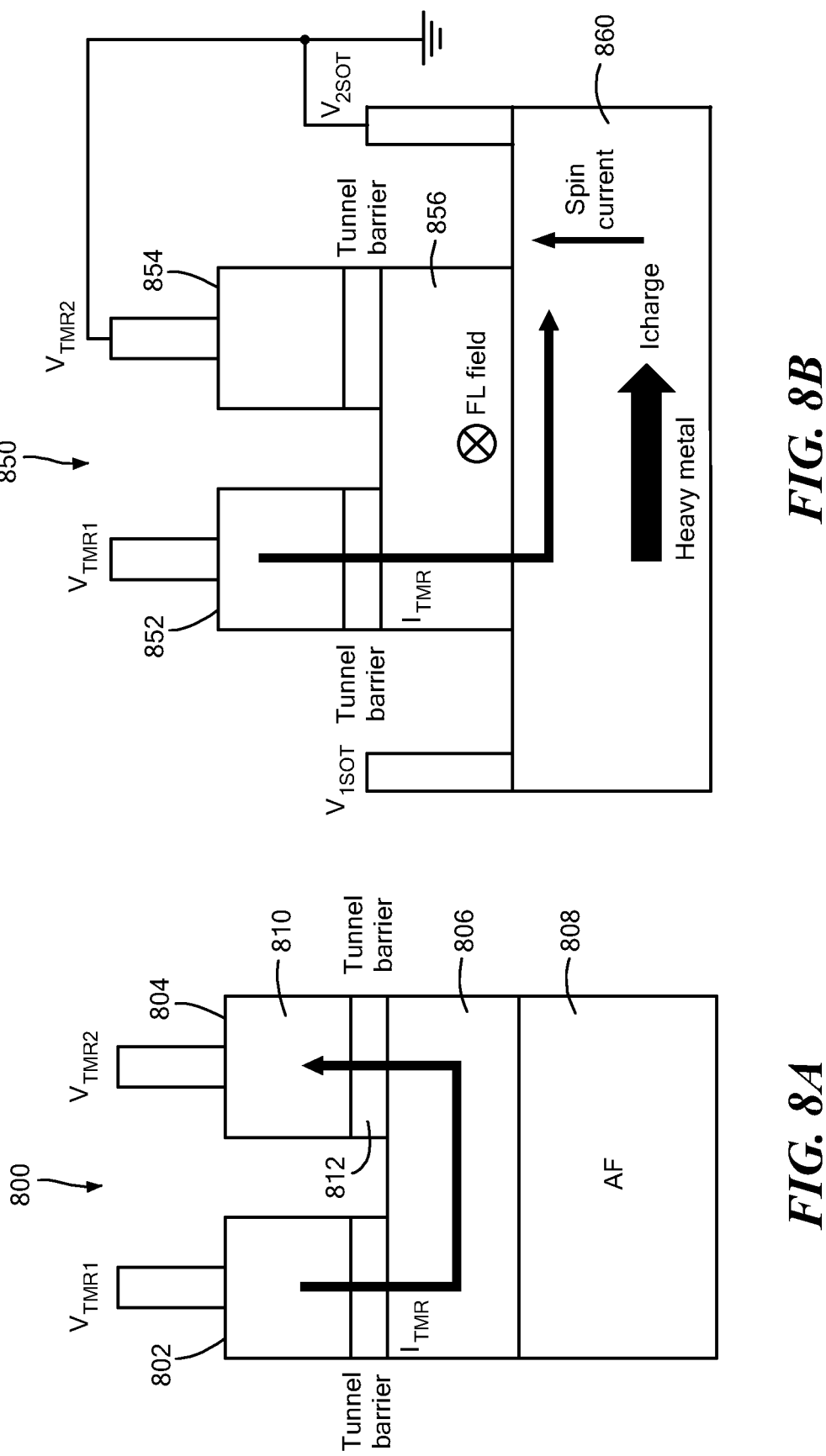
FIG. 8A is a schematic representation of a TMR sensor having series-connected pillars coupled to respective terminals to measure voltages $V_{TMR1}$, $V_{TMR2}$.
FIG. 8B shows a TMR sensor having series-connected first and second pillars coupled to respective terminals to measure voltages $V_{TMR1}$, $V_{TMR2}$.

FIG. 8A shows a TMR sensor 800 having series-connected first and second pillars 802, 804 coupled to respective terminals to measure voltages $V_{TMR1}$, $V_{TMR2}$. A reference layer 806 is oriented by an AF layer 808 and separated from a free layer 810 by a barrier layer 812. TMR current $I_{TMR}$ flows when $V_{TMR1} - V_{TMR2} > 0$.

FIG. 8B shows a TMR sensor 850 having series-connected first and second pillars 852, 854 coupled to respective terminals to measure voltages $V_{TMR1}$, $V_{TMR2}$. A reference layer 856 is oriented by an FL field from a charge current Icharge in a heavy metal (HM) layer 860 as a spin current flows up toward the reference layer. The charge current direction may define the axis of sensitivity for the sensor. In the illustrated embodiment, the FL field orientation is into the page as indicated by the x in a circle. In embodiments, the charge current Icharge, which may be referred to as an SOT current, flows when $V_{1SOT} - V_{2SOT} > 0$ across the HM layer 860. In the illustrated embodiment, current $I_{TMR}$ flows in the first pillar 852 into the HM layer 860 while bypassing the second pillar 854 if the applied SOT current is applied concurrently with a pillar read operation with a common ground reference, e.g., $V_{TMR2}$ and $V_{2SOT}$ are coupled to ground.

Figure 8C:
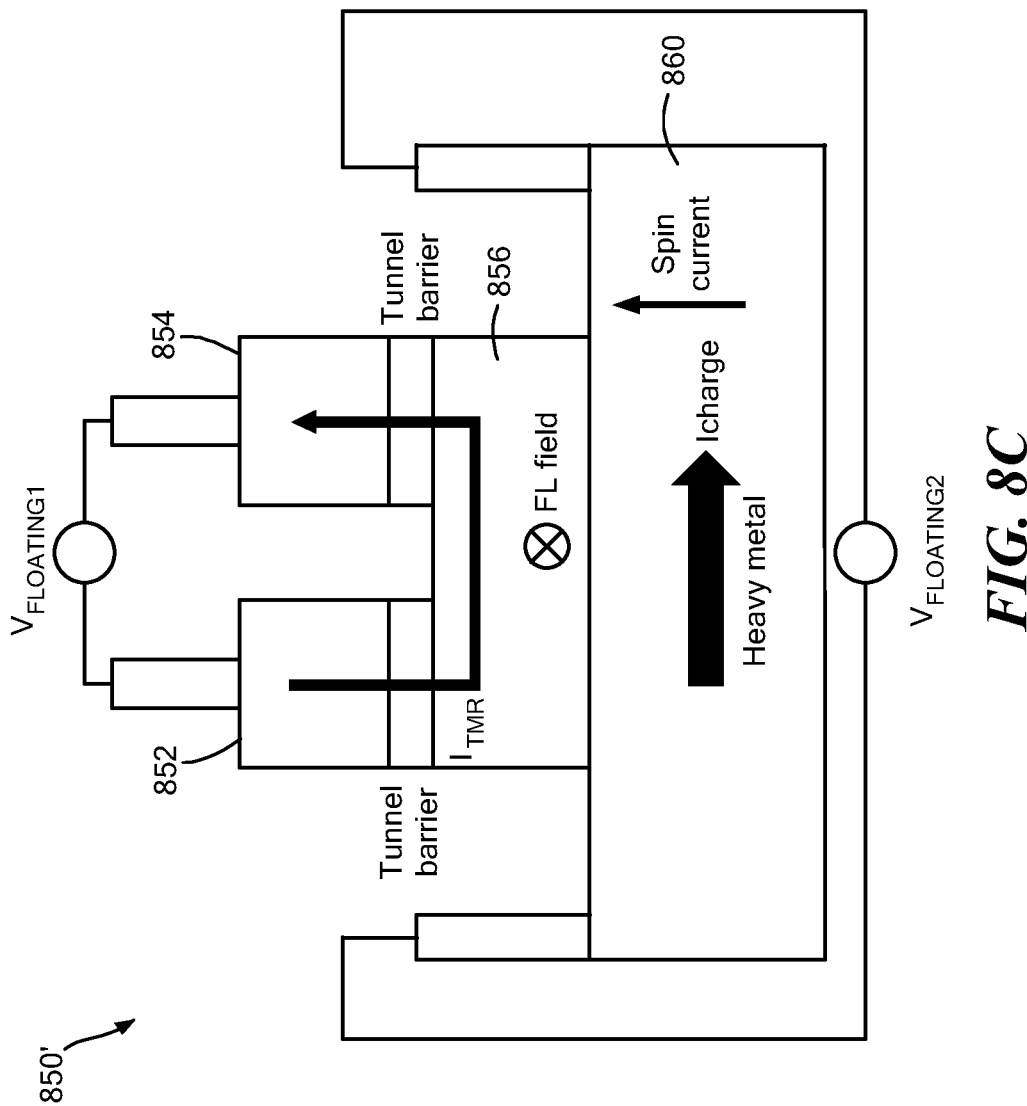
FIG. 8C is a schematic representation of the sensor of FIG. 8B having floating voltage supplies coupled across the pillars and the HM layer.

FIG. 8C shows the sensor of FIG. 8B with a sensor 850' having floating voltage supplies coupled across the pillars and the HM layer. In the illustrated embodiment, a first voltage supply $V_{FLOATING1}$ is coupled across terminals for the first and second TMR pillars 852, 854 and a second voltage supply $V_{FLOATING2}$ is coupled across the HM layer 860. With this arrangement, a charge current Icharge can be injected in the HM layer 860 while reading the TMR current $I_{TMR}$. This configuration is operable for two serially connected pillars.

Figures 9A, 9B:
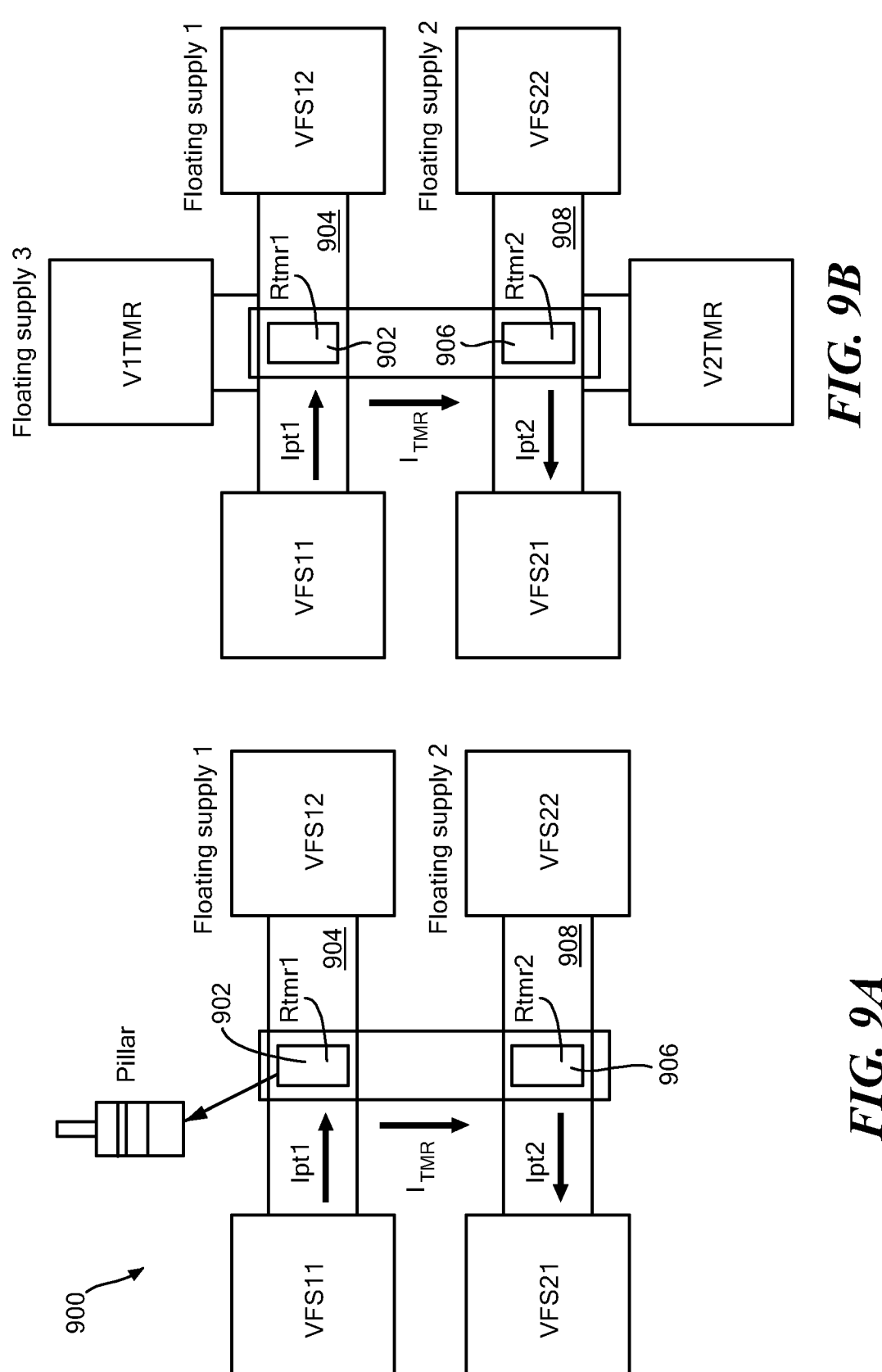
FIG. 9A is a schematic representation of an example TMR sensor having two serially connected devices having independent control of the ferromagnetic layer by respective SOT currents.
FIG. 9B is a schematic representation of an example TMR sensor having two serially connected devices having independent control of the ferromagnetic layer by respective SOT currents with an independent reading of the two TMP pillars.

FIG. 9A shows a TMR sensor 900 having two serially connected devices having independent control of the ferromagnetic layer by respective SOT currents. A first pillar 902 is coupled to a first HM layer 904 with a first voltage supply VFS11, VFS12 coupled across the first HM layer to generate a first SOT current Ipt1. A second pillar 906 is coupled to a second HM layer 908 with a second voltage supply VFS11, VFS22 coupled across the second HM layer 908 to generate a second SOT current Ipt2. In the illustrated embodiment, the SOT currents Ipt1, Ipt2 flow in opposite directions. A TMR current Itmr flows from the first pillar 902 to the second pillar 906, which is the current flowing between the first and second floating voltage supplies. FIG. 9B shows the addition of a third floating voltage supply V1TMR, VTMR2 coupled across the terminals for the first and second pillars 902, 906 to enable TMR voltage read operations. In some configurations, floating voltage supplies are limited to two serially connected pillars.

Figure 10A:
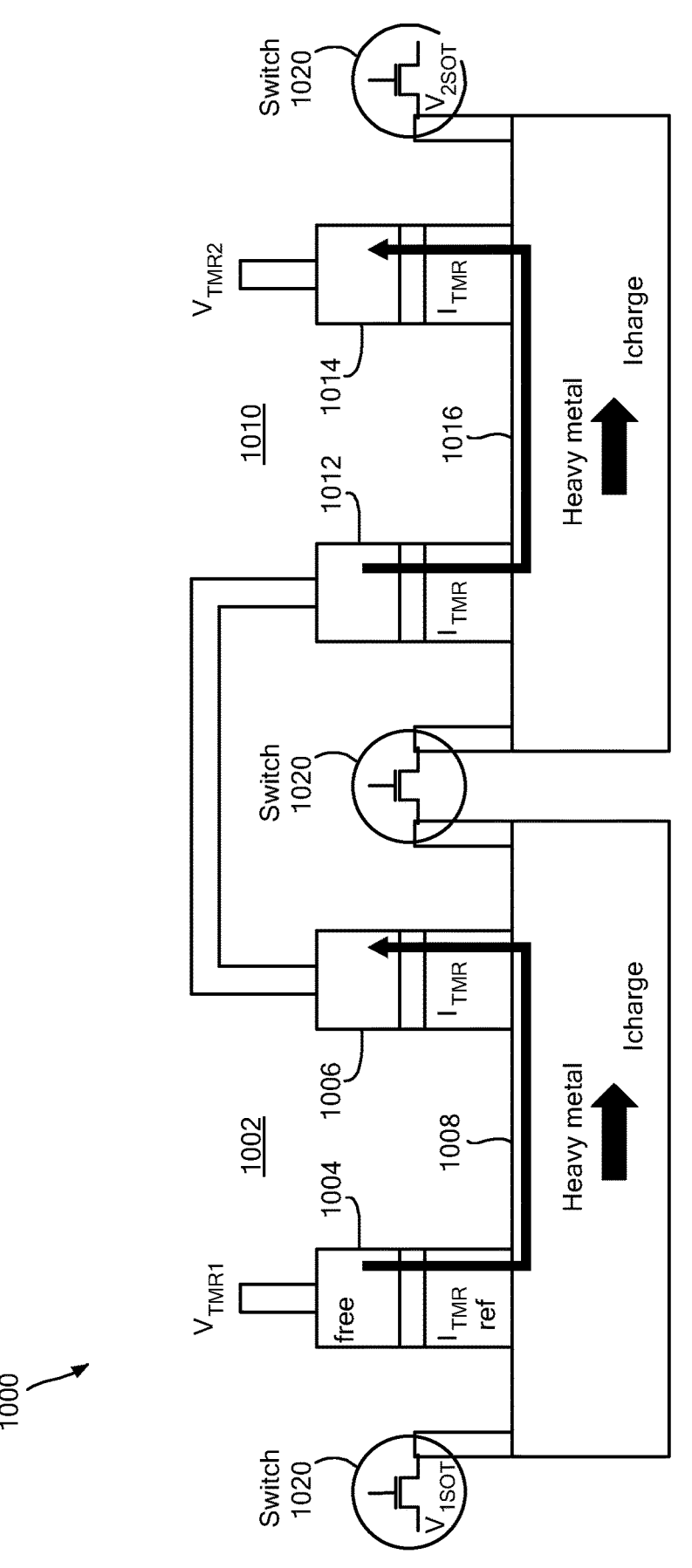
FIG. 10A is a schematic representation of an example TMR sensor having serially connected devices where there is no concurrent charge current on a HM layer and TMR read operation.

FIG. 10A shows a TMR sensor 1000 having serially connected devices where there is no concurrent charge current on a HM layer and TMR read operation. A first TMR device 1002 includes first and second pillars 1004, 1006 on a first HM layer 1008 through which a charge current Icharge can flow. A second TMR device 1010 similarly includes third and fourth pillars 1012, 1014 on a second HM layer 1016. The second and third pillars 1006, 1012 are electrically connected. The voltage across terminals $V_{TMR1}$, $V_{TMR2}$ for the first and fourth pillars 1004, 1014 can be read. Switches 1020, such as transistor, can be coupled between each TMR device 1002, 1010.

When the switches 1020 are ON, the SOT current Icharge is applied to orient the reference (ref) magnetisation (V1SOT–V2SOT>0). The TMR terminals VTMR1, VTMR2 are floating. The reference layer keeps its orientation once the SOT current Icharge is switched OFF by turning OFF the switches 1020 due to ferromagnetic material anisotropy.

The switches 1020 are OFF when the TMR voltage is read: VTMR1–VTMR2>0.

It should be noted that the reference layer cannot be oriented by the spin current concurrently with the TMR read operation. The spin current is used only to switch the reference layer into a stable orientation.

Figure 10B:
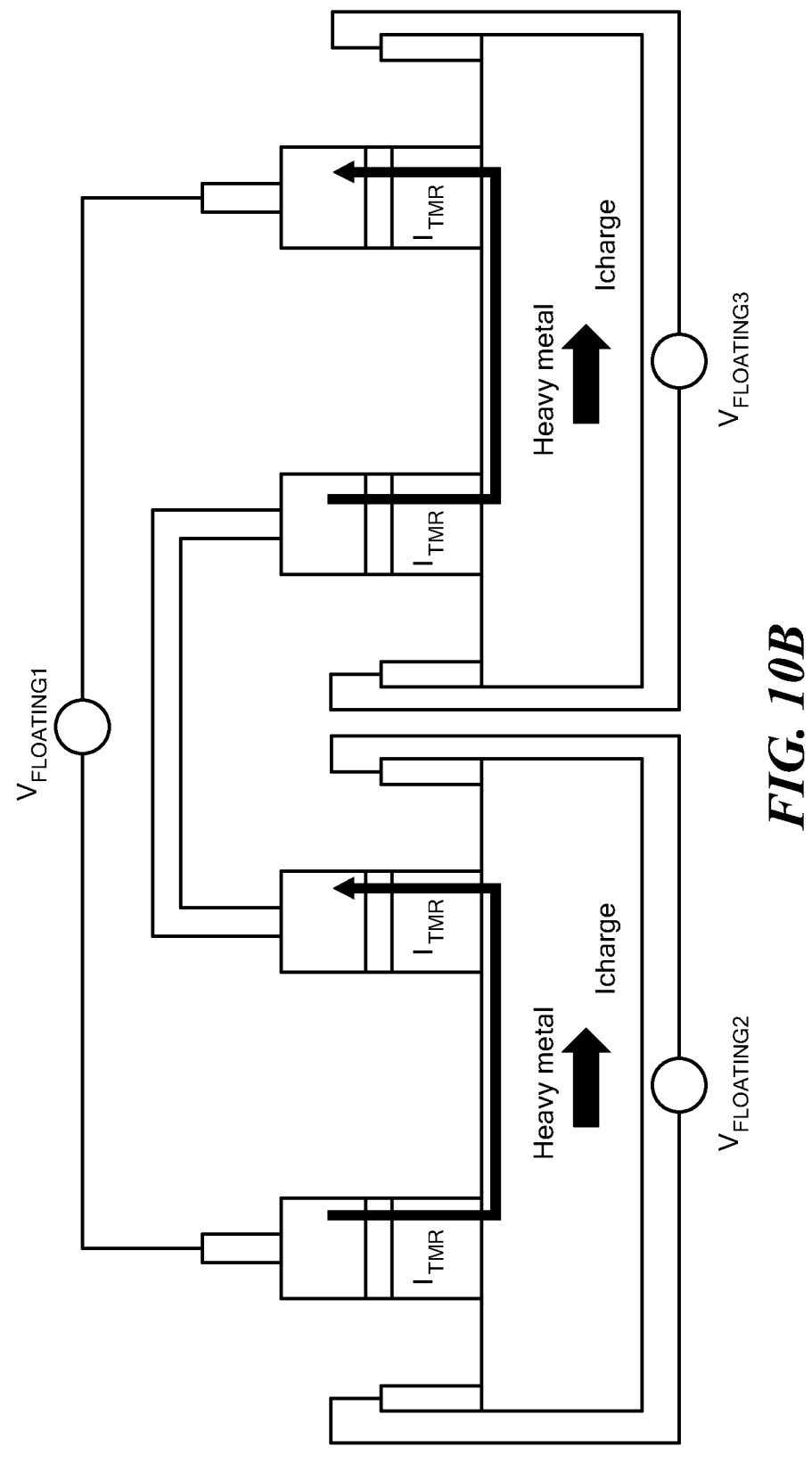
FIG. 10B is a schematic representation of an example sensor with serially connected devices with concurrent charge current on the HM layer and TMR read operation.

FIG. 10B shows serially connected devices with concurrent charge current on the HM layer and TMR read operation. A first floating voltage supply $V_{FLOATING1}$ is coupled across the first and fourth pillars 1004, 1014 of the TMR devices, a second floating voltage supply $V_{FLOATING2}$ is coupled across the first HM layer 1008 for the first device to generate a first SOT current and a third floating voltage supply $V_{FLOATING3}$ is coupled across the second HM layer 1016.

In this configuration, floating voltage supplies are used without a common ground reference so that concurrent charge current in the HM layers and TMR read operations are enabled.

Figure 11A:
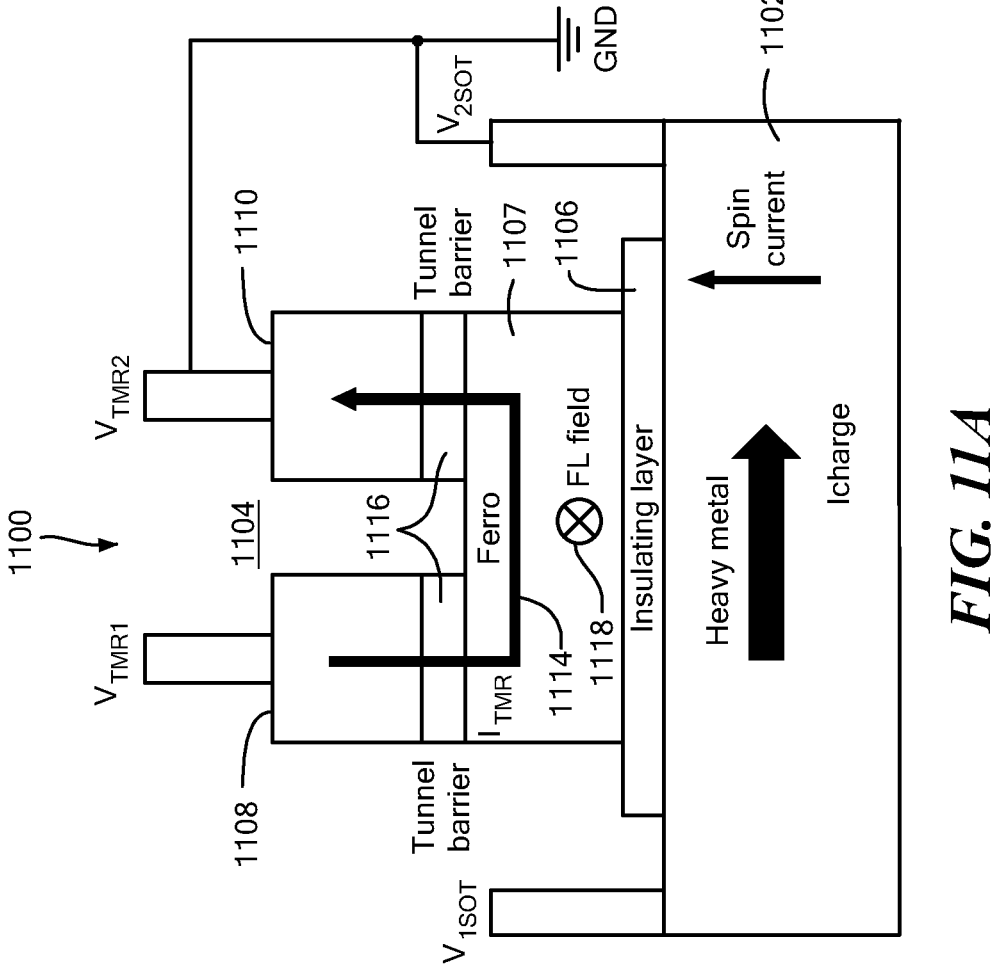
FIG. 11A is a schematic representation of example TMR sensor having electrical isolation between an HM layer and a TMR device.

FIG. 11A shows an example TMR sensor 1100 having electrical isolation between an HM layer 1102 and a TMR device 1104. An insulating layer 1106 is located between a ferromagnetic layer 1107 providing the first and second pillars 1108, 1110 and the HM layer 1102. An SOT current Icharge through the HM layer 1102 generates an FL field with a spin current flowing up to the ferromagnetic layer 1107. This can be referred to as a HM/Insulate/Ferro configuration.

Due to the insulating layer 1106, the TMR current $I_{TMR}$ flows through the serially connected pillars 1108, 1110, and the bottom ferromagnetic layer 1107 in contact with the insulating layer remains magnetically controlled by the charge current Icharge flowing through the heavy metal layer 1102.

The insulating layer 1106 should provide electrical insulation between the ferromagnetic layer 1107 and the HM layer 1102, so that a TMR current 1114 flows through the tunnel barrier 1116 of the serially connected pillars 1108, 110 instead of flowing to the HM layer 1102. In addition, the insulating layer 1106 should allow transmission of the FL field 1118 due to good conduction of the spin current, or by Rashba coupling.

In embodiments, the insulating layer 1106 material provides the above properties (electrical isolation and FL field transmission (e.g., ferromagnetic insulator) with direct coupling. In other embodiments, the properties are combined, such as by a non-magnetic but insulating layer and a magnetic coupling (e.g., roughness Néel coupling, RKKY coupling, direct coupling through pinholes). The layer(s) may have a nanometric thickness.

It is understood that any suitable material can be used for the insulating layer to meet the needs of a particular application. Example materials include ferromagnetic or ferrimagnetic insulators, e.g., $CoFe_2O_4$, $MgTiO_3$, spinel ferrites, YIG, TIG, manganites, etc., antiferromagnetic insulators, e.g., NiO or CoO, and/or non-magnetic insulators, e.g., MgO.

Figure 11B:
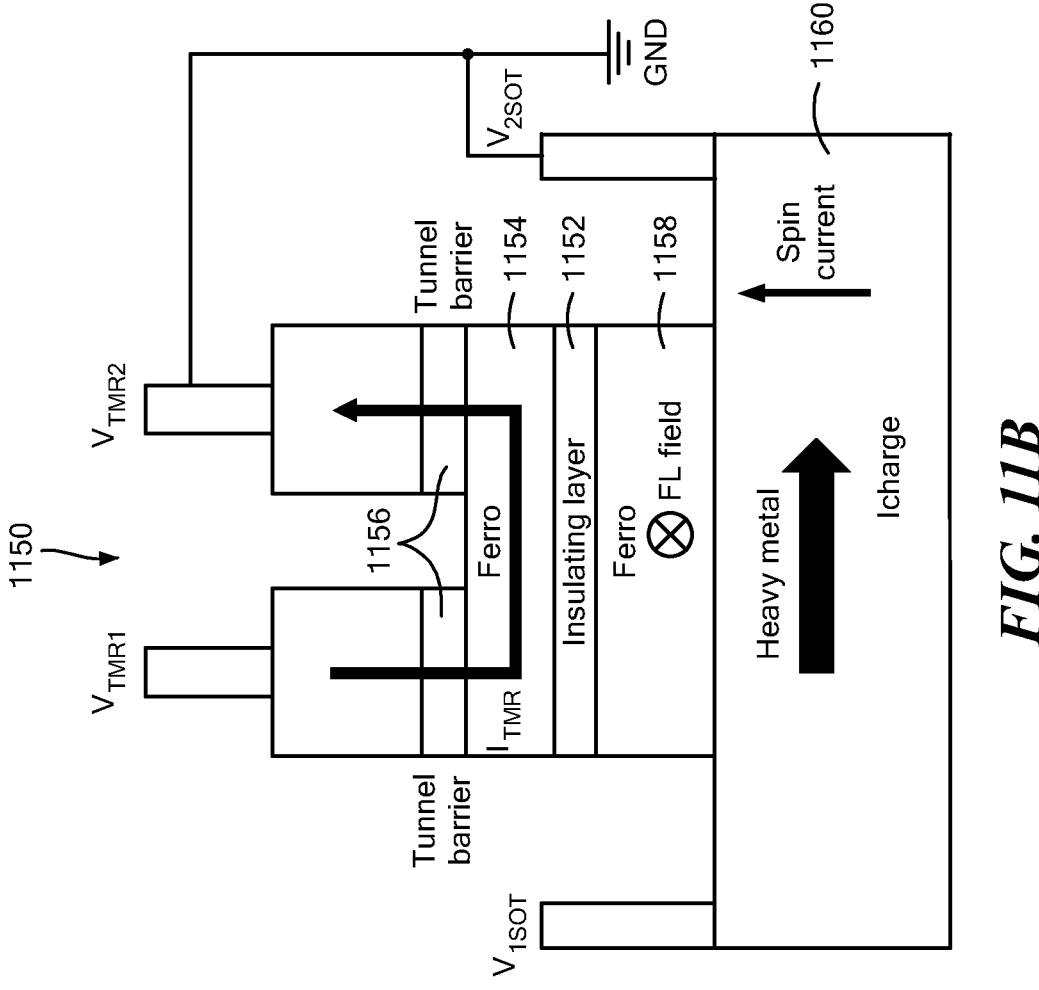
FIG. 11B is a schematic representation of example sensor having some commonality with the sensor of FIG. 11A but with an insulating layer between ferromagnetic material extending up to the barrier material and ferromagnetic material extending down to the HM layer.

FIG. 11B shows an embodiment 1150 having some commonality with the sensor of FIG. 11A but with an insulating layer 1152 between ferromagnetic material 1154 extending up to the barrier material 1156 and ferromagnetic material 1158 extending down to the HM layer 1160. This can be considered a HM/Ferro/Insulate/Ferro configuration. With this arrangement, ferromagnetic material 1158 is directly in contact with the HM layer 1160 and magnetically coupled to the ferromagnetic material 154 under the barrier 1156 through the insulating layer 1152.

Figure 11C:
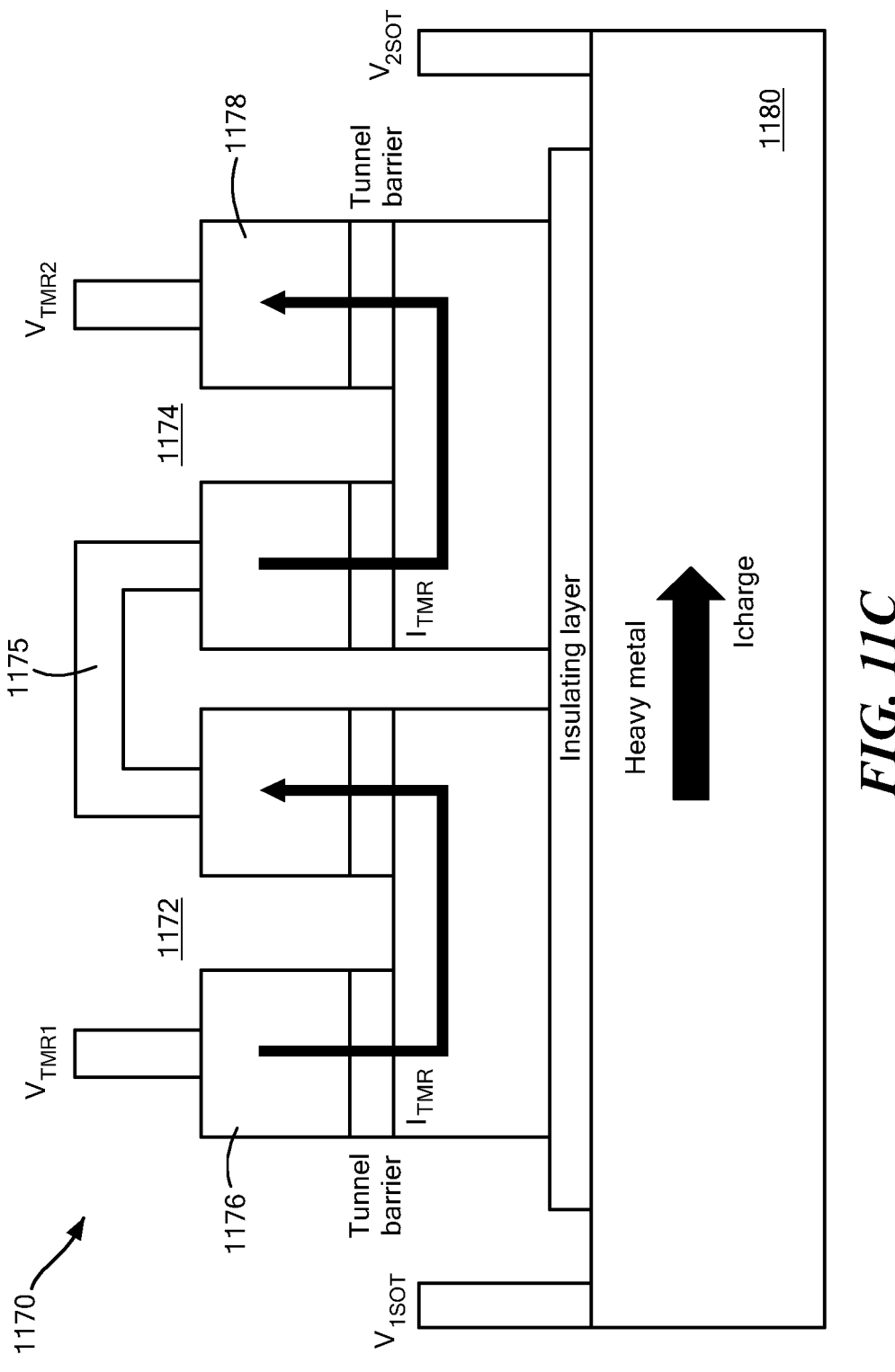
FIG. 11C is a schematic representation of example sensor having electrical isolation between an HM layer and a TMR device.

FIG. 11C shows an example sensor 1170 having electrical isolation between an HM layer and a TMR device. First and second TMR devices 1172, 1174 are electrically coupled with terminals coupled across first and fourth pillars 1176, 1178. A voltage supply $V_{1SOT}$, $V_{2SOT}$ across the HM layer 1180 generates an SOT current Icharge in the HM layer. A TMR current $I_{TMR}$ flows in the pillars of the devices 1172, 1174 including a conductive material 1175 connecting the first and second TMR devices 1172, 1174.

With this arrangement, any practical number of pillars can be coupled in series to meet the needs of a particular application.

In another embodiment, the insulating layer can be located between ferromagnetic material extending to the barrier layer and ferromagnetic material extending to the HM layer, as shown in FIG. 11B.

Figures 12A, 12B:
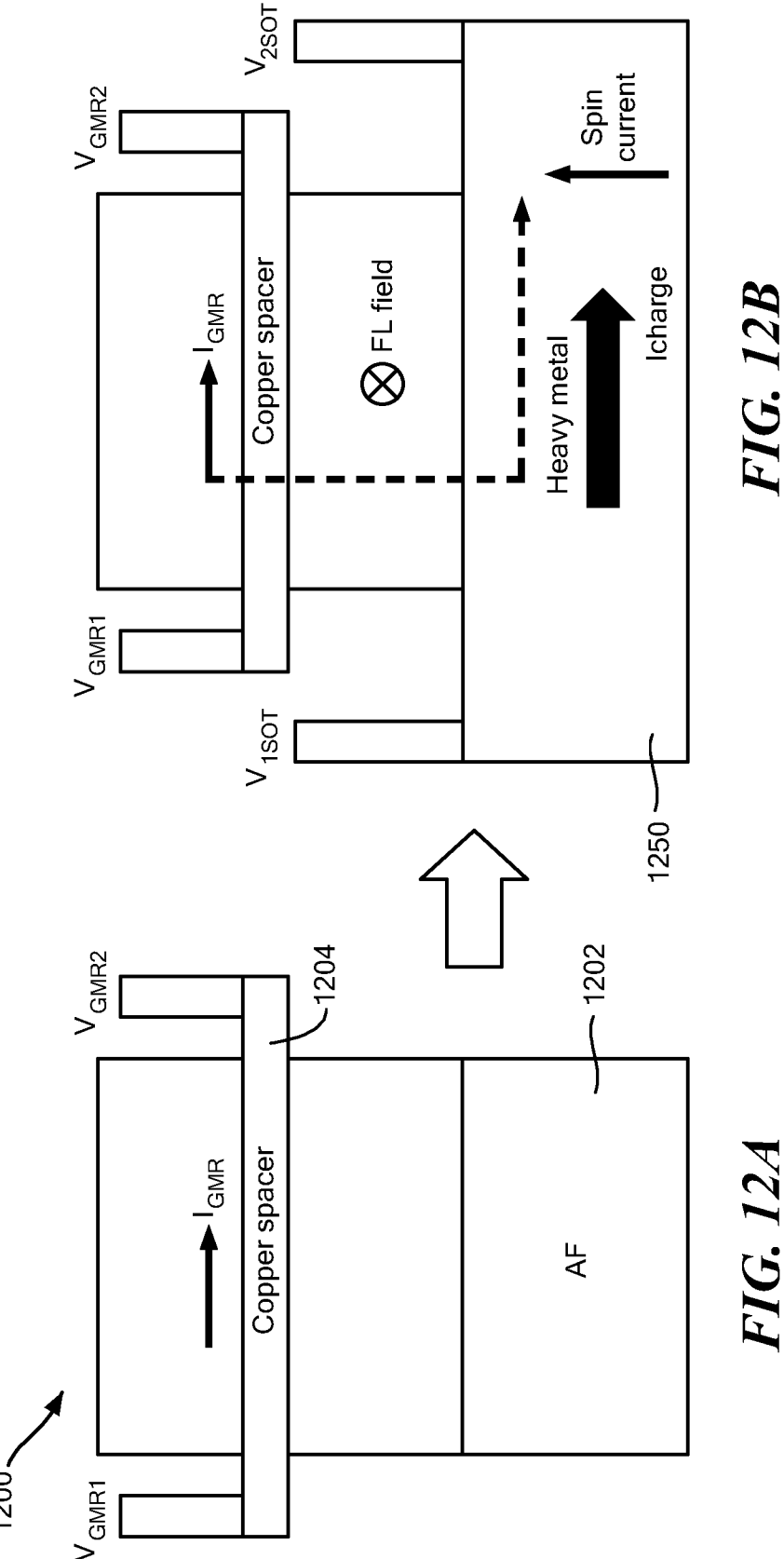
FIG. 12A is a schematic representation of example GMR sensor having an antiferromagnetic (AF) layer and a copper spacer located in ferromagnetic material.
FIG. 12B is a schematic representation of example GMR sensor in which an HM layer replaces the AF layer.

FIG. 12A shows an example GMR sensor 1200 having an antiferromagnetic (AF) layer 1202 and a copper spacer 1204 located in ferromagnetic material. AF GMR current $I_{GMR}$ current flows parallel to the plane of the AF layer 1202 along the copper spacer.

FIG. 12B shows an example GMR sensor in which an HM layer 1250 replaces the AF layer. An SOT current is generated by voltage supply $V_{1SOT}$, $V_{1SOT}$ This configuration bypasses some of the GMR current $I_{GMR}$ into the HM layer 1250 which cancels some of the GMR effect.

Figures 13A, 13B:
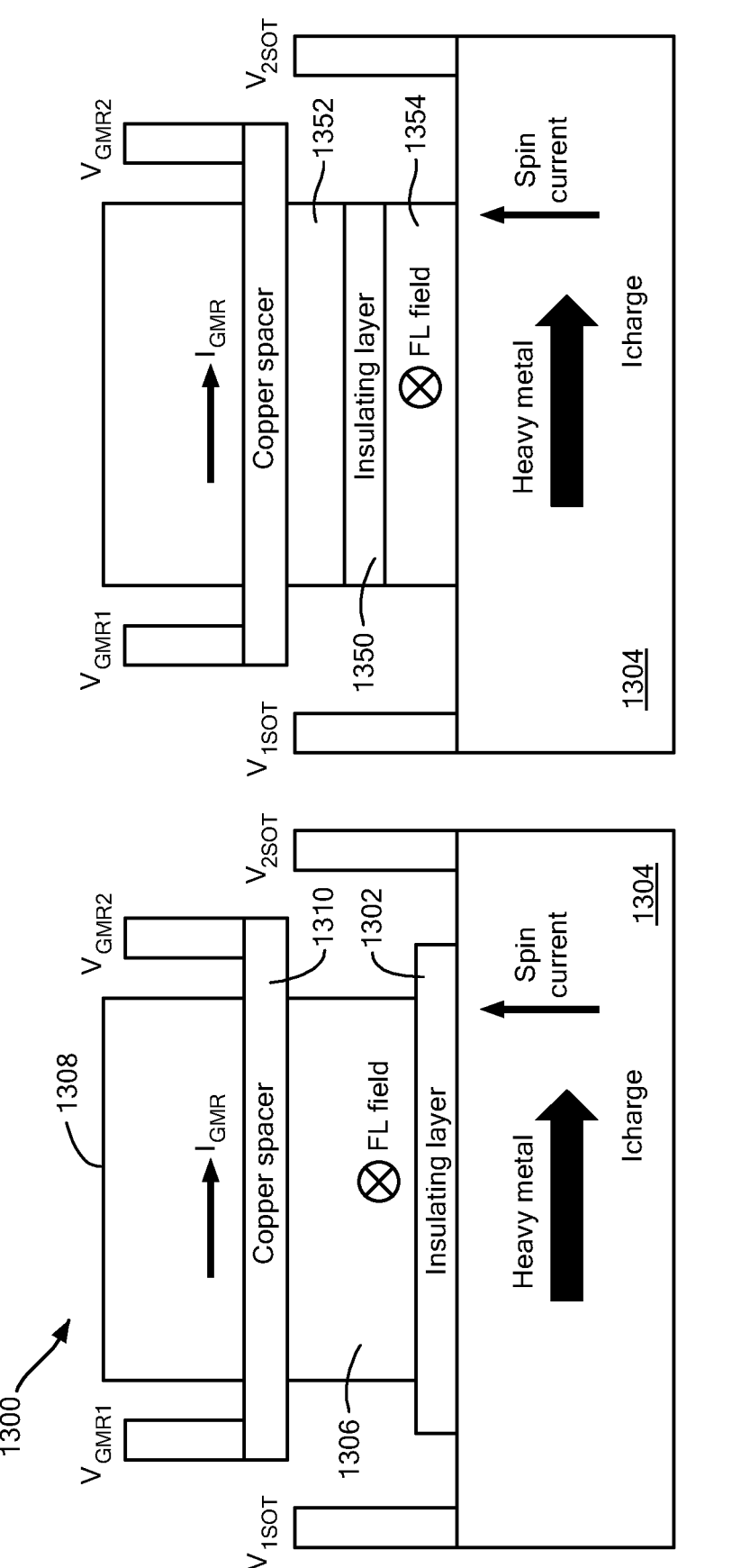
FIG. 13A is a schematic representation of example GMR sensor having an insulating layer on an HM layer.
FIG. 13B is a schematic representation of example of a GMR configuration with an insulating layer between ferromagnetic material extending up to the spacer and ferromagnetic material extending down to the HM layer.

FIG. 13A shows an example GMR sensor 1300 having an insulating layer 1302 on an HM layer 1304. A reference layer 1306 and a free layer 1308 are separated by a spacer 1310, such as copper. The GMR voltage can be read at terminals $V_{GMR1}$, $V_{GMR2}$. An SOT current Icharge is generated in the HM layer by a voltage supply $V_{1SOT}$, $V_{2SOT}$ across the HM layer 1304 so that a spin current flows up from the HM layer. The insulating layer 1302 isolates the GMR structure from the HM layer 1304 while maintaining control of the reference layer 1306 with an operational FL field.

FIG. 13B shows a similar configuration with an insulating layer 1350 between ferromagnetic material 1352 extending up to the spacer 1310 and ferromagnetic material 1354 extending down to the HM layer 1304.

Figure 14A:
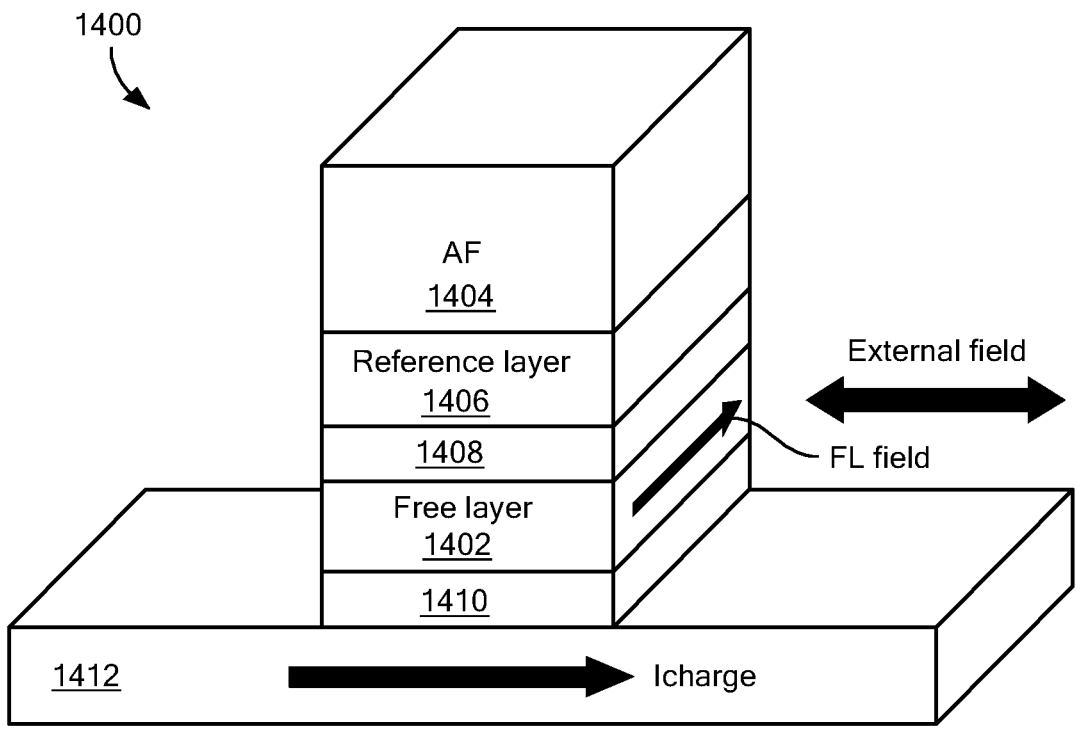
FIG. 14A is a schematic representation of example sensor having SOT control of a free layer.

FIG. 14A shows an example sensor 1400 having SOT control of a free layer 1402. An antiferromagnetic (AF) layer 1404 is adjacent a reference layer 1406, which is separated from the free layer 1402 by a barrier layer 1408. An insulating layer 1410 is between the free layer 1402 and an HM layer 1412. An SOT current Icharge can flow in the HM layer 1412.

An external field to be sensed is parallel to the charge current Icharge in the HM layer 1412 and perpendicular to the FL field applied to the free layer 1402 by the spin current induced by the charge current. The FL field bias modulates the sensitivity of the stack so that the stack sensitivity is modulated by the charge current. The reference layer 1406 is blocked by the AF layer in an AF/ferro configuration.

Figure 14B:
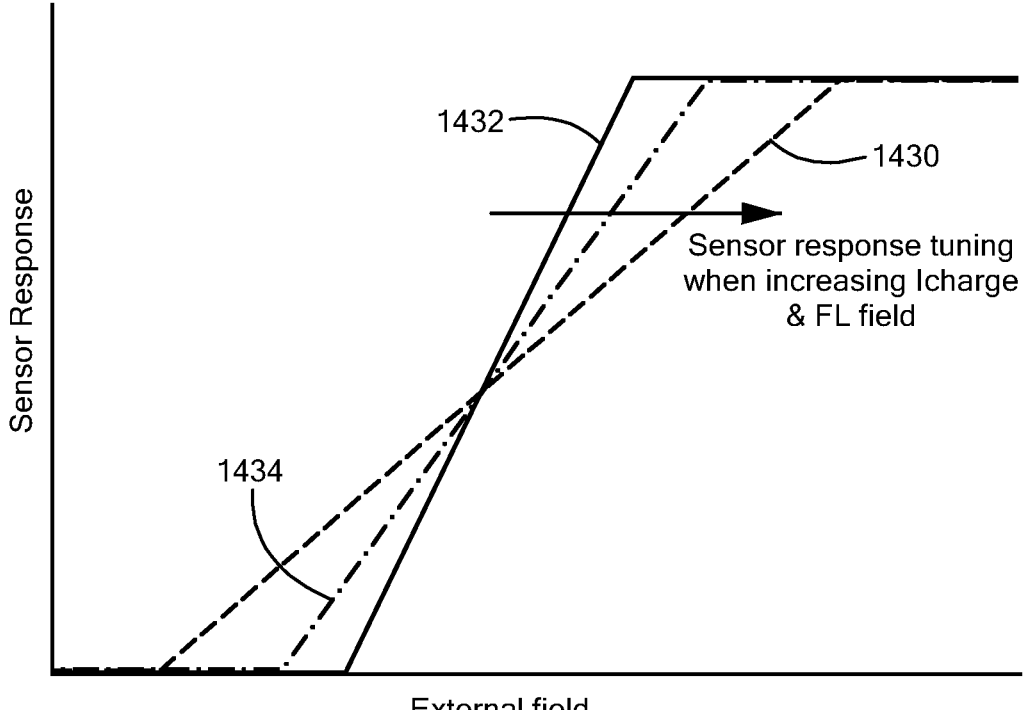
FIG. 14B is a graphical representation of the response for the sensor of FIG. 14A.

FIG. 14B shows a graphical representation of the response for the sensor 1400 of FIG. 14A. The charge current and the FL field are perpendicular to the sensitivity axes of the sensor and linearize the sensor response for an external field 1430. As can be seen, the larger Icharge 1432 and FL field 1434 are, the lower the sensor sensitivity. Sensitivity can be dynamically modulated by varying Icharge. Field slope may be factor in sensor sensitivity.

In embodiments, sensitivity control is desirable in a variety of applications. For example, a sensor positioned relatively far from a target may require a higher sensitivity level than a sensor relatively near the target. It is understood that adjusting a dynamic range of the sensor is desirable in various sensor applications.

Figure 14C:
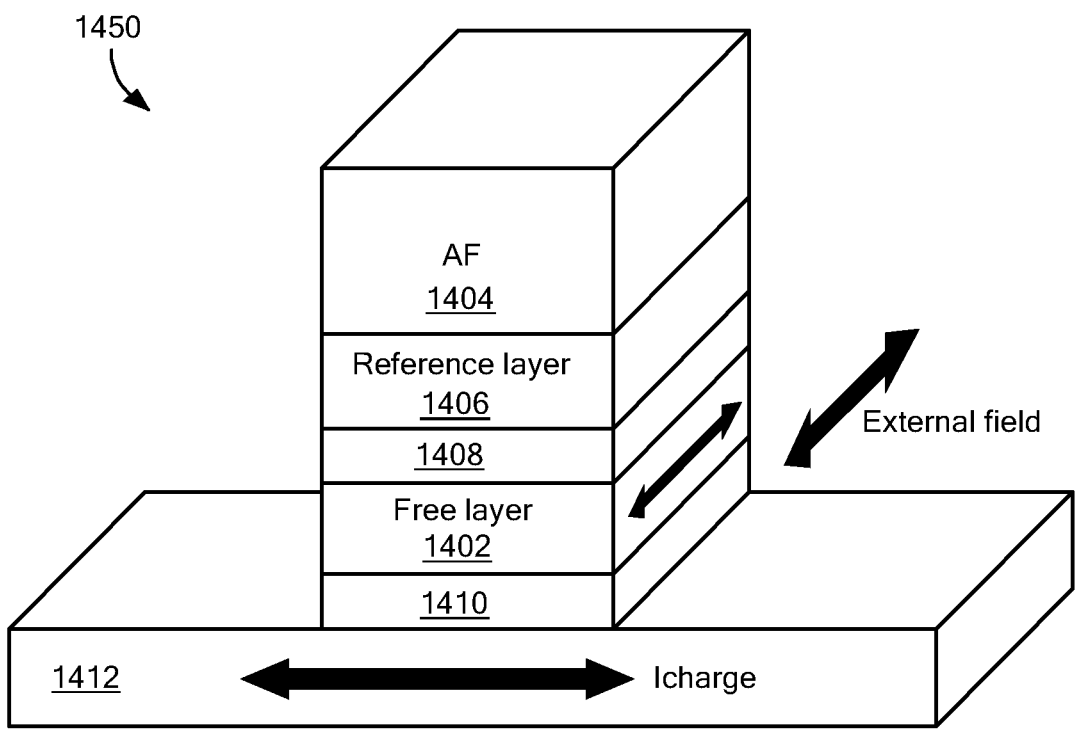
FIG. 14C is a schematic representation of example sensor having a similar stackup as the sensor of FIG. 14A with different operating characteristics.

FIG. 14C shows an example sensor 1450 having a similar stackup as the sensor 1400 of FIG. 14A with different operating characteristics. An external field to be sensed is perpendicular to the charge current Icharge and parallel to the FL field applied to the free layer 1402 by the spin current induced by the charge current. The FL field bias can be used to cancel the external field in a feedback loop configuration. As will be readily appreciated, this configuration can eliminate the need for a feedback loop coil used in conventional sensors.

In embodiments, the SOT current is controlled to generate a FL field to cancel the external field in a desired way in a closed loop sensor configuration. For example, it may be desirable to cancel only a portion of the external field or cancel it in a way to meet the needs of a particular application. In embodiments, SOT field cancellation may be orders of magnitude, e.g., 5-10×, greater than coil-based cancellation for the same current level.

Figure 14D:
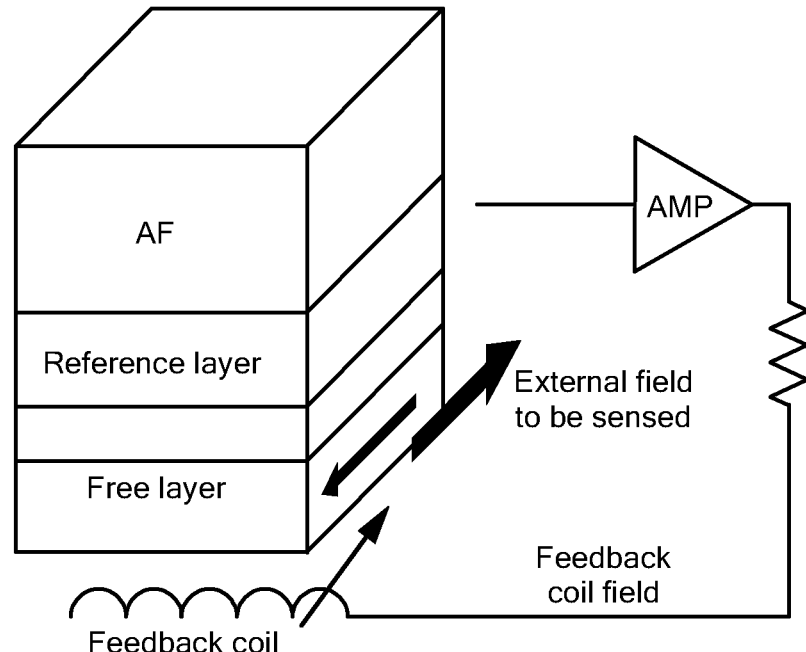
FIG. 14D is a schematic representation of an example AF-based MR sensor having a feedback coil coupled to an amplifier AMP for cancelling a sensed external field.
Figure 14E:
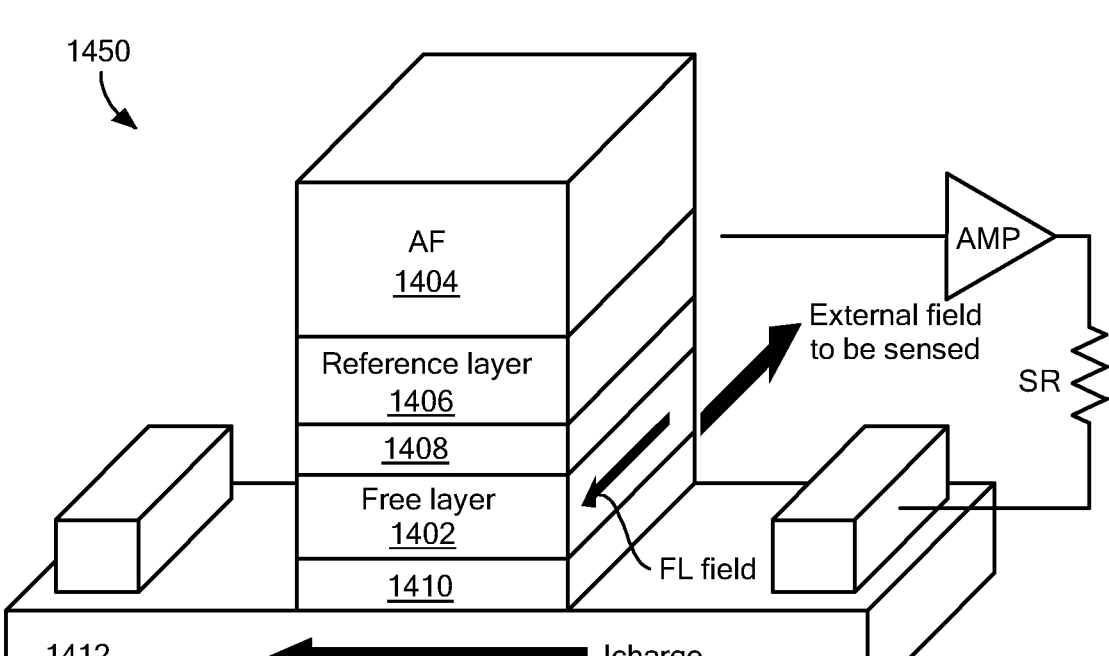
FIG. 14E shows further detail for the sensor of FIG. 14C.

FIG. 14D shows an AF-based MR sensor having a feedback coil coupled to an amplifier AMP for cancelling a sensed external field. FIG. 14E shows further detail for the sensor 1450 of FIG. 14C including a sense resistor SR coupled to an amplifier AMP that can replace the feedback coil in FIG. 14D. The feedback current is directly injected in the HM layer 1412 to generate the charge current Icharge which results in a spin current and FL field that counteracts the external field to be sensed.

Figure 14F:
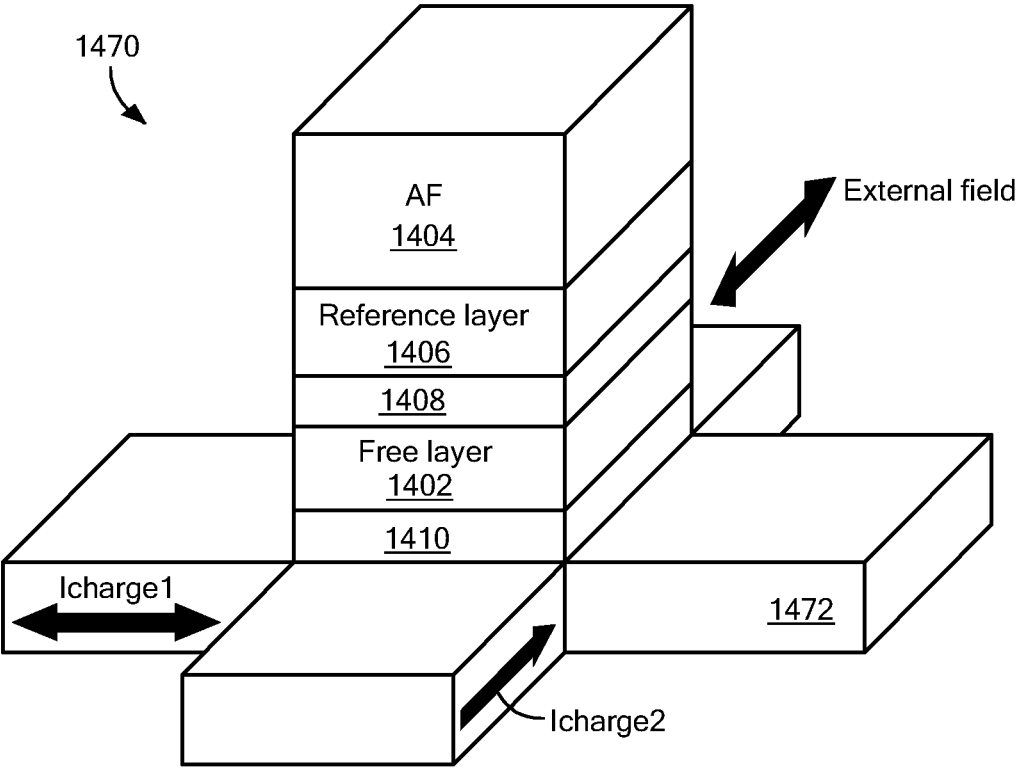
FIG. 14F is a schematic representation of an example sensor having an AF layer, reference layer, barrier layer, free layer, insulating layer, and HM layer with a first SOT current Icharge1 having a first direction and a second SOT current Icharge2 having a second direction.

FIG. 14F shows an example sensor 1470 having an AF layer 1404, reference layer 1406, barrier layer 1408, free layer 1408, insulating layer 1410, and HM layer 1472. In the illustrated embodiment, a first SOT current Icharge1 has a first direction and a second SOT current Icharge2 has a second direction. The first SOT current Icharge1 generates a first FL field in the direction of the applied external field and can be used to cancel the field in a feedback loop configuration. The second SOT current Icharge2 generates a second FL field perpendicular to the external field. The second FL field acts as a bias that modulates the sensitivity of the sensor.

Figure 14G:
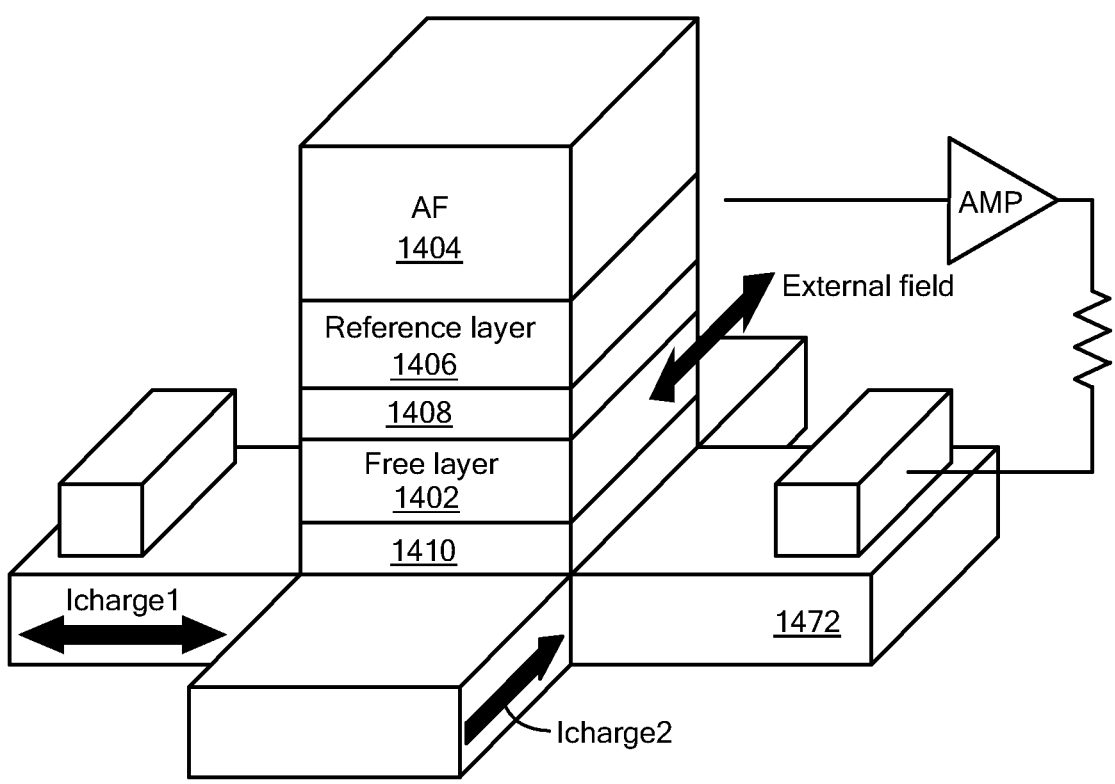
FIG. 14G shows further detail for the sensor of FIG. 14F with SOT control of the free layer with first and second charge currents Icharge1, Icharge2 having different directions in the HM layer.

FIG. 14G shows further detail for the sensor of FIG. 14F with SOT control of the free layer with first and second charge currents Icharge1, Icharge2 having different directions in the HM layer, as described above. The feedback current is directly injected in the HM layer to control the first SOT current Icharge1 to generate field counteracting the applied external field. The second SOT current Icharge1 can be used to linearize the stack response.

Figure 15:
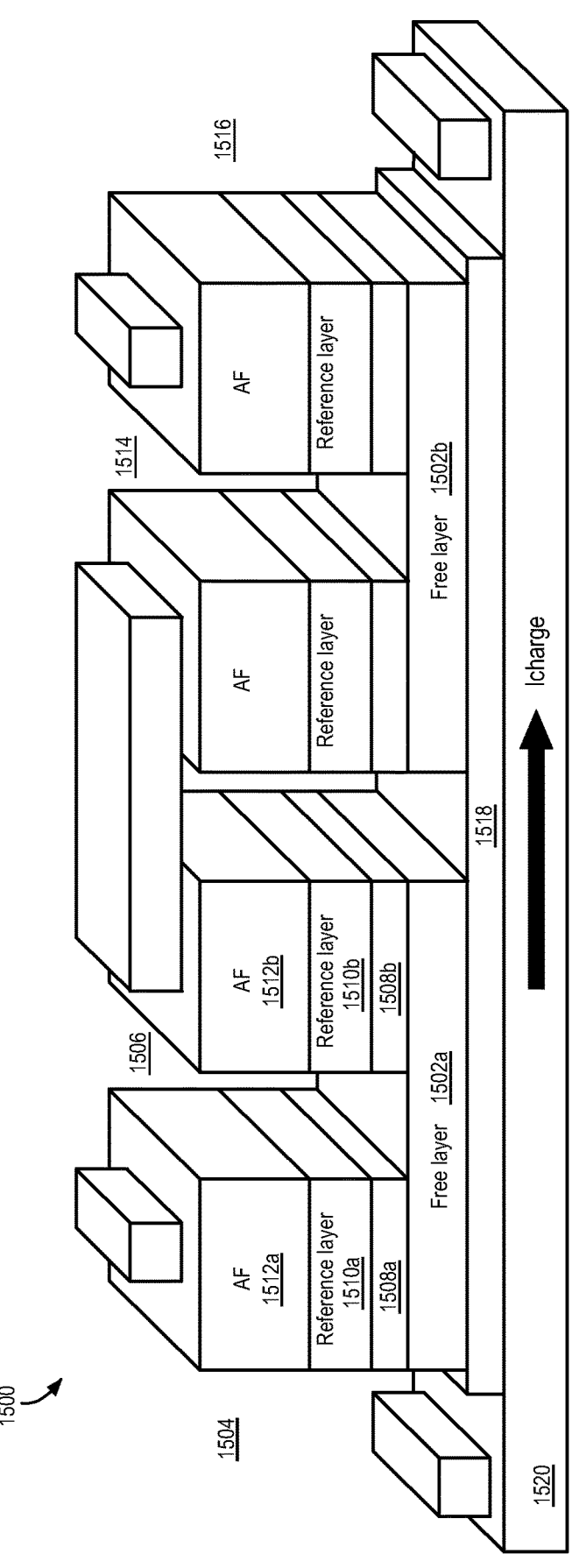
FIG. 15 is a schematic representation of an example sensor with SOT control of a free layer in a TMR device having serially connected pillars.

FIG. 15 shows an example sensor 1500 with SOT control of a free layer in a TMR device having serially connected pillars. In the illustrated embodiment, a first free layer 1502$_a$ is shared by first and second pillars 1504, 1506 having respective barriers 1508$_{a,b}$, reference layers 1510$_{a,b}$, and AF layers 1512$_{a,b}$. Third and fourth pillars 1514, 1516 have similar stack ups on a shared second free layer 1502$_b$. The first and second free layers 1502$_{a,b}$ are connected to an insulating layer 1518 on an HM layer 1520 through which an SOT current Icharge may flow to control the free layers 1502.

Figure 16A:
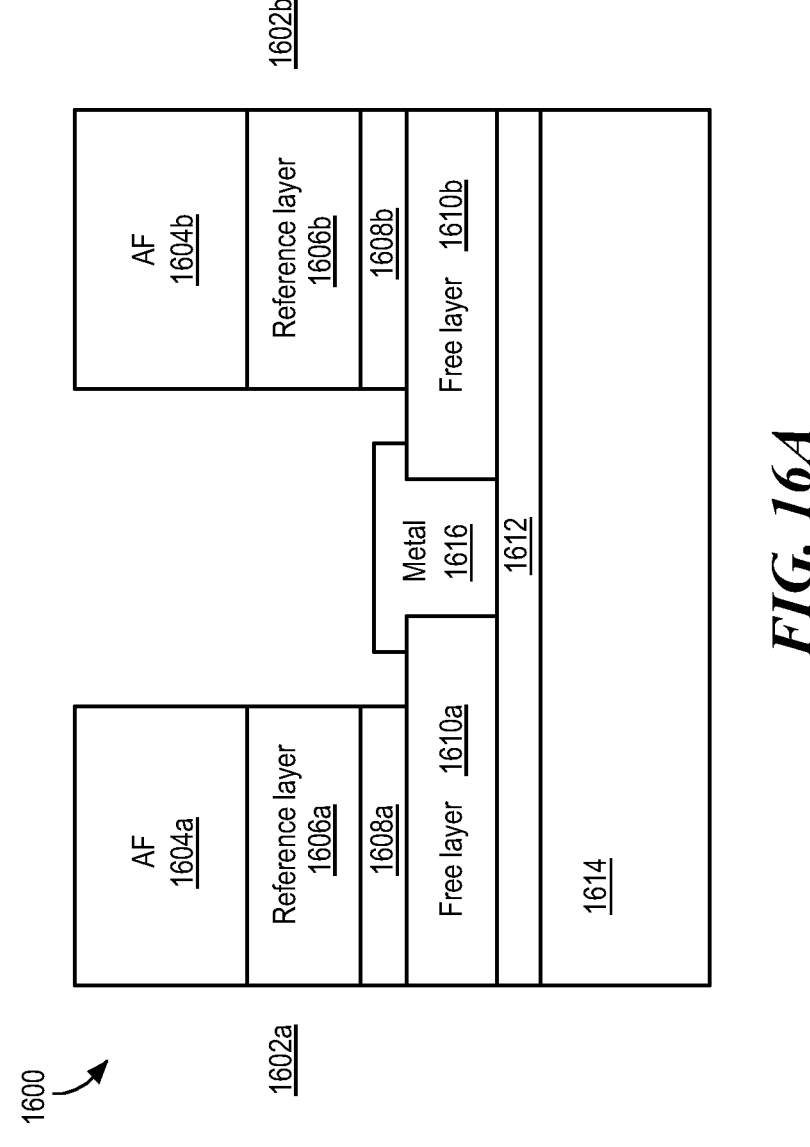
FIG. 16A is a side view and FIG. 16B is an isometric view of an example sensor having SOT control of a free layer in a device having multiple serially connected pillars.
Figure 16B:
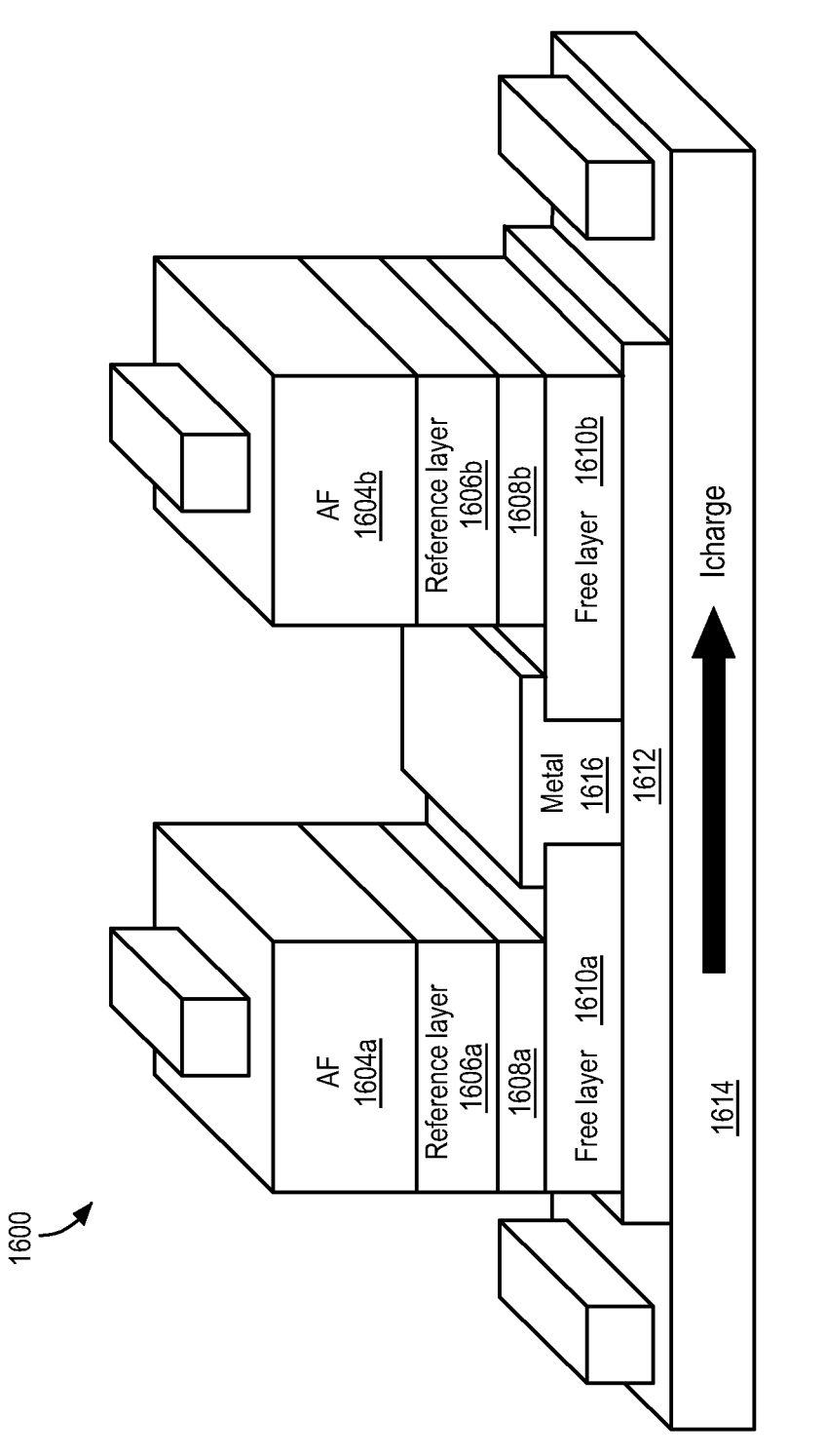

FIG. 16A is a side view and FIG. 16B is an isometric view of a sensor 1600 having SOT control of a free layer in a device having multiple serially connected pillars. A first pillar 1602$a$ includes a stack of an AF layer 1604, a reference layer 1606, a barrier 1608, and a free layer 1610. A second pillar 1602$b$ includes a similar stack. The first and second pillars 1602$a,b$ are located on an insulating layer 1612 on an HM layer 1614. A metal material 1616 is connected between the free layers 1610$a,b$ of the first and second pillars 1602$a,b$. In the illustrated embodiment, the metal 1616 is on the insulating layer 1612 to fully fill the region between the free layers 1610$a,b$.

Figure 17:
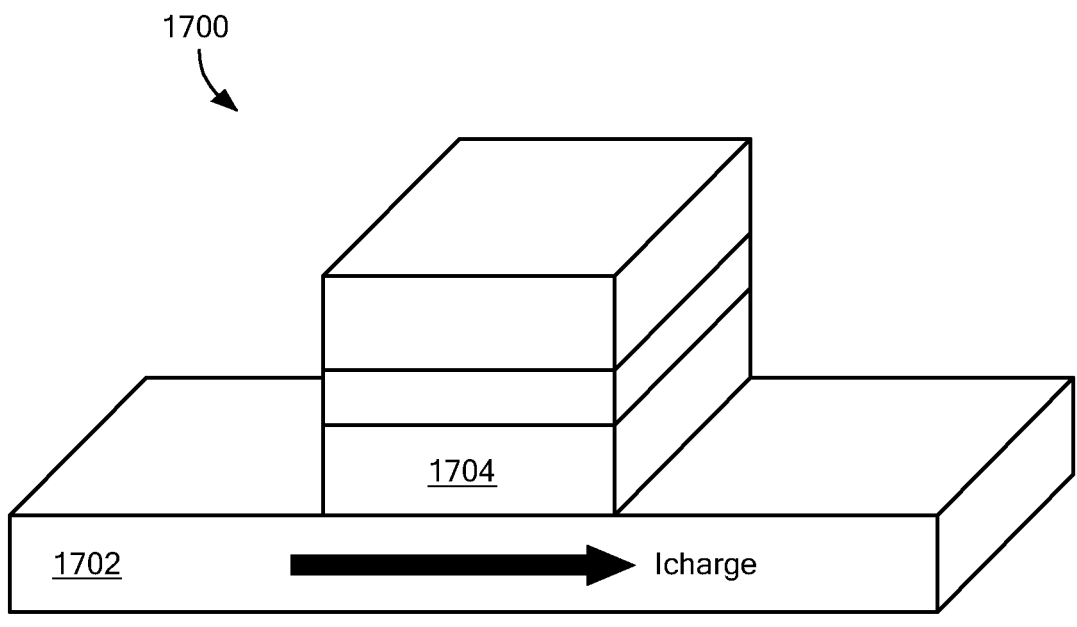
FIG. 17 is a schematic representation of an example sensor having an SOT current Icharge in an HM layer to control a reference layer without isolation of the ferromagnetic material.

FIG. 17 shows an example sensor 1700 having an SOT current Icharge in an HM layer 1702 to control a reference layer 1704 without isolation of the ferromagnetic material. A charge current Icharge is applied to switch the reference layer 1704 in a stable direction, but cannot be applied when reading the TMR.

Figure 18:
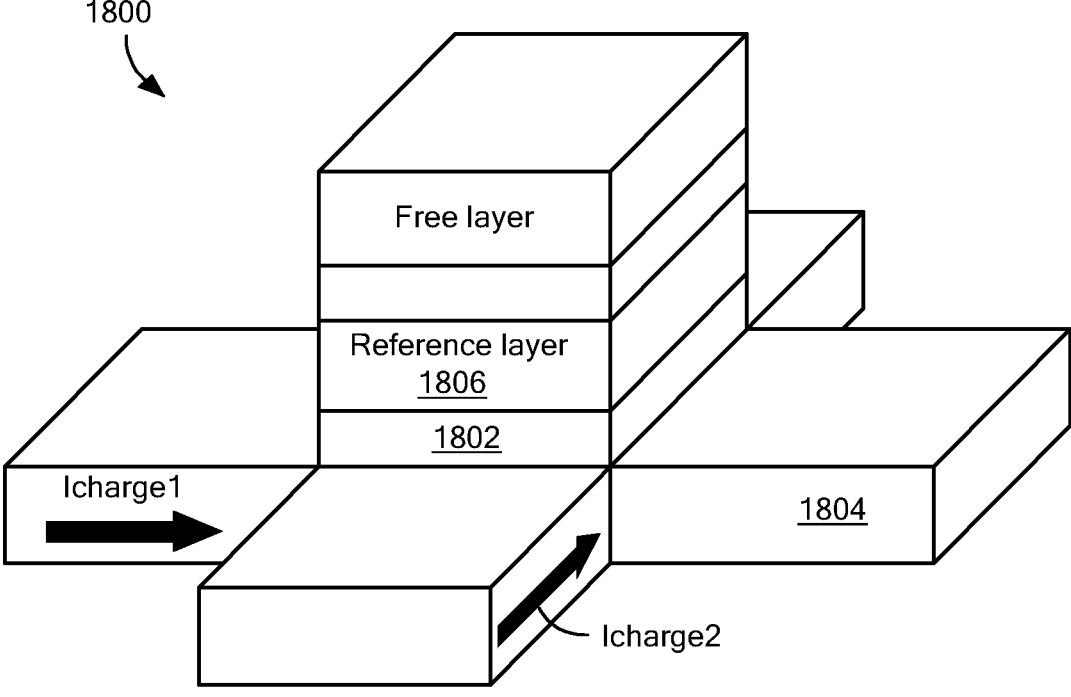
FIG. 18 is a schematic representation of an example sensor having an insulating layer between an HM layer and a reference layer.

FIG. 18 shows an example sensor 1800 having an insulating layer 1802 between an HM layer 1804 and a reference layer 1806. A charge current Icharge in the HM layer 1804 can be controlled so that the FL field can be applied concurrently with the TMR read operation due to the isolation layer. In embodiments, the FL field orientation can range from 0 to 360 degrees from a reference point by adjusting directions and magnitude first and second charge currents Icharge1, Icharge2 in the HM layer 1804.

In embodiments, a sensor may have a "zero" degree position defined by the first and second charge currents Icharge1, Icharge2. Deviation from the zero degree position can be determined in a manner to meet the need of a particular application.

Figure 19:
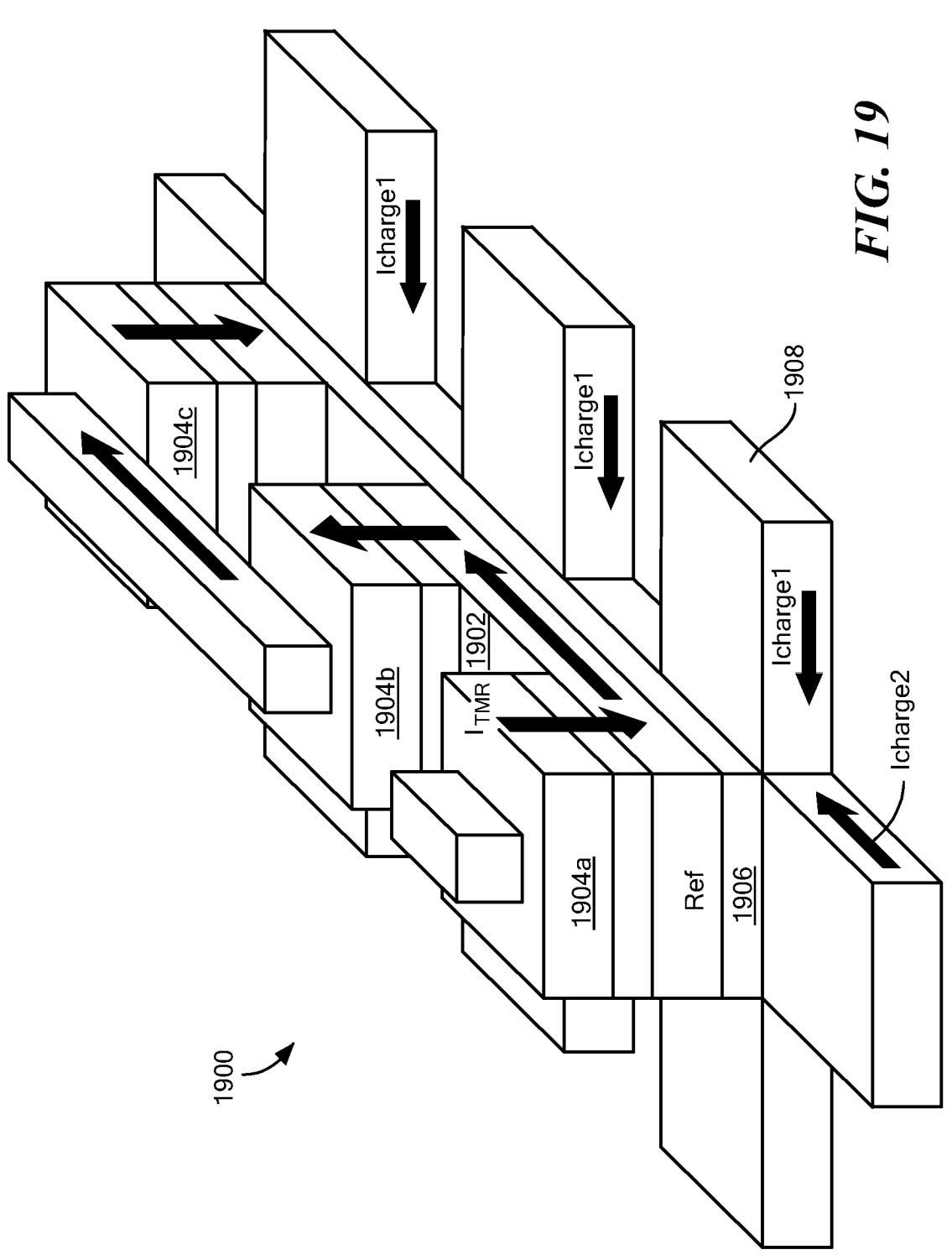
FIG. 19 is a schematic representation of an example TMR sensor having an SOT controlled reference layer.

FIG. 19 shows an example TMR sensor 1900 having an SOT controlled reference layer. In the illustrated embodiment, first, second, and third pillars 1904$a,b,c$ are connected to an insulating layer 1906. The first and second pillars 1904$a,b$ have a common reference layer 1902. Each pillar 1904 is controlled by a respective HM layer 1908 having respective first and second charge currents Icharge1, Icharge2. TMR current I$_{TMR}$ flows as shown down in the first pillar 1904$a$, over to the second pillar 1904$b$ via the common reference layer, up the second pillar to the third pillar 1904$c$ via a conductor 1910.

In embodiments, SOT control of the reference layer enables switching the reference orientation at relatively high frequencies, such as in the order or nanosecondsup to microseconds to enable cancellation of 1/f electrical noise and offset using known chopping technique. In other embodiments, the reference layer can be oriented to any angle from 0 to 360 degrees. This enables an angle sensor based on TMR resistance variation with the angle between the reference layer set by the SOT current and the free layer set by the external field. The orientation of the external field may match the reference orientation resulting in the minimum TMR resistance when the reference is rotated from 0 to 360 degrees by SOT currents.

It is understood that example sensor embodiments can include any practical number of pillars. In general, increasing the number of pillars increases the signal-to-noise ratio (SNR) of the sensor. In some embodiments, hundreds, or thousands of pillars can be used.

Example embodiments of an MR sensor having SOT layer control provide advantages over known MR sensors. For example, controlling a ferromagnetic magnetization by applying a current through a heavy metal (HM) brings much more versatility in fabricating sensors as compared to the usual interaction between an antiferromagnetic layer and the ferromagnetic layer. In some embodiments, the ferromagnetic layer magnetic orientation can be set to any direction by applying the current in a selected direction on the heavy metal layer contacting the ferromagnetic layer using a dedicated HM layer configuration. The strength of the FL field applied to the ferromagnetic layer can also be modulated by changing the current amplitude on the HM layer. The ferromagnetic layer can also be switched at higher frequencies than conventional sensors. Example sensor embodiments include dynamic sensing characteristics, such as reduced noise by high frequency switching of the reference, reduced current in a feedback loop architecture, and the like.

As used herein, the term "anisotropy" or "anisotropic" refer to a particular axis or direction to which the magnetization of a ferromagnetic or ferrimagnetic layer tends to orientate when it does not experience an additional external field. An axial anisotropy can be created by a crystalline effect or by a shape anisotropy, both of which allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be aligned along that anisotropy in the absence of an external field. In the case of a GMR or TMR element, a directional anisotropy provides an ability to obtain a coherent rotation of the magnetic field in a magnetic layer in response, for example, to an external magnetic field.

In general, magnetic materials can have a variety of magnetic characteristics and can be classified by a variety of terms, including, but not limited to, ferromagnetic, antiferromagnetic, and nonmagnetic. Description of the variety of types of magnetic materials is not made herein in detail. However, let it suffice here to say, that a ferromagnetic material is one in which magnetic moments of atoms within the ferromagnetic material tend to, on average, align to be both parallel and in the same direction, resulting in a nonzero net magnetic magnetization of the ferromagnetic material.

An antiferromagnetic material is one in which magnetic moments within the antiferromagnetic material tend to, on average, align to be parallel, but in opposite directions in sub-layers within the antiferromagnetic material, resulting in a zero net magnetization.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field. As used herein, the terms "target" and "magnetic target" are used to describe an object to be sensed or detected by a magnetic field sensor or magnetic field sensing element.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Unless otherwise specified, the term "substantially" refers to values that are within ±10%. For example, a first direction that is "substantially" perpendicular to a second direction may refer to a first direction that is within ±10% of making a 90° angle with the second direction.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A device for sensing an applied magnetic field, comprising:
   a magnetoresistance (MR) device having a ferromagnetic material, wherein the MR device comprises first and second MR elements having the ferromagnetic material in common, wherein the first and second MR elements are configured to generate a sense current in response to the applied magnetic field;
   a heavy metal layer configured to flow a charge current; and
   an insulating layer between the ferromagnetic material and the heavy metal layer configured to electrically insulate and to magnetically couple the heavy metal layer and the ferromagnetic layer for generating a field like (FL) field in the ferromagnetic material in response to the charge current.

2. The device according to claim 1, wherein the MR device comprises a GMR device.

3. The device according to claim 1, wherein the MR device comprises a TMR device having pillars.

4. The device according to claim 3, wherein the TMR device comprises a free layer, a barrier, and a reference layer.

5. The device according to claim 4, wherein an orientation of the free layer is controlled by the charge current.

6. The device according to claim 4, wherein an orientation of the reference layer is controlled by the charge current.

7. The device according to claim 1, wherein the insulating layer is configured to conduct a spin current to generate the FL field.

8. The device according to claim 1, wherein the insulating layer is configured to generate the FL field via Rashba coupling.

9. The device according to claim 1, wherein the insulating layer is configured to generate a damping like field.

10. The device according to claim 1, wherein the insulating layer comprises a ferrimagnetic insulator.

11. The device according to claim 1, wherein the insulating layer comprises a ferromagnetic insulator.

12. The device according to claim 1, wherein the insulating layer comprises as first layer configured to provide electrical isolation and a second layer to provide magnetic coupling of the heavy metal layer and the ferromagnetic layer.

13. The device according to claim 1, wherein the insulating layer is between first and second portions of the ferromagnetic layer, wherein the first portion extends to a barrier and the second portion extends to the heavy metal layer.

14. The device according to claim 13, wherein the first and second portions of the ferromagnetic layer are magnetically coupled through the insulating layer.

15. The device according to claim 1, wherein the device comprises more than two TMR pillars.

16. The device according to claim 1, wherein the charge current is configured to control a sensitivity of the device for an applied external field parallel to a direction of the charge current and perpendicular to the FL field on a free layer of the ferromagnetic material.

17. The device according to claim 1, wherein the charge current is configured to at least partially cancel an external field perpendicular to a direction of the charge current and parallel to the FL field on a free layer of the ferromagnetic material.

18. The device according to claim 1, wherein the charge current comprises a first charge current configured to generate the FL field in a direction of an applied external field and a second charge current configure to control a sensitivity of the device for the applied external field.

19. The device according to claim 1, wherein the device is configured to sense a external field and generate a feedback current corresponding to the external field and inject the feedback current into the heavy metal layer to form at least a portion of the charge current.

20. The device according to claim 1, wherein the MR device comprises at least first, second, third, and fourth TMR pillars connected in series, wherein at least two of the at least first, second, third, and fourth TMR pillars share a common free layer.

21. The device according to claim 20, wherein the common layer is disposed on the insulating layer.

22. The device according to claim 1, wherein the MR device comprises at least first and second TMR pillars each having respective free layers on the insulating layer, and further including a metal material connecting the free layers of the first and second pillars.

23. The device according to claim 1, wherein the charge current comprises first and second charge currents configured to orient a reference layer of a TMR device to any orientation within a three hundred and sixty degree rotation in a plane of the reference layer.

24. The device according to claim 1, wherein the device comprises a TMR device having a resistance variation with an angle between the orientation of the reference layer and an orientation angle of a free layer set by an applied external field.

25. The device according to claim 1, wherein the charge current comprises first and second charge currents configured to cancel 1/f electrical noise, where f is switching frequency.

26. A method, comprising:

employing a magnetoresistance (MR) device having a ferromagnetic material, wherein the MR device comprises first and second MR elements having the ferromagnetic material in common, wherein the first and second MR elements are configured to generate a sense current in response to an applied magnetic field;

employing a heavy metal layer configured to flow a charge current; and configuring an insulating layer between the ferromagnetic material and the heavy metal layer configured to electrically insulate and to magnetically couple the heavy metal layer and the ferromagnetic layer for generating a field like (FL) field in the ferromagnetic material in response to the charge current.

27. The method according to claim 26, wherein the MR device comprises a free layer, a barrier, and a reference layer.

28. The method according to claim 27, further including controlling an orientation of the free layer by the charge current.

29. The method according to claim 27, further including controlling an orientation of the reference layer by the charge current.

30. The method according to claim 26, wherein the insulating layer is configured to conduct a spin current to generate the FL field.

31. The method according to claim 26, wherein the charge current comprises first and second charge currents configured to orient a reference layer of a TMR device to any orientation within a three hundred and sixty degree rotation in a plane of the reference layer.

32. The method according to claim 26, wherein the MR device has resistance variation with an angle between an orientation of a reference layer and an orientation angle of a free layer set by an applied external field.

33. A device, comprising:

a magnetoresistance (MR) device having a free layer, a barrier, and a reference layer; and a heavy metal layer connected to the MR device and configured to flow first and second charge currents, wherein the first and second charge currents are configured to generate a field like (FL) field to orient the reference layer in a range from 0 to 360 degrees.

* * * * *